US011818892B2

(12) United States Patent
Lee et al.

(10) Patent No.: US 11,818,892 B2
(45) Date of Patent: Nov. 14, 2023

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Dong Uk Lee, Icheon-si (KR); Hae Chang Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/843,762

(22) Filed: Jun. 17, 2022

(65) Prior Publication Data
US 2022/0320118 A1 Oct. 6, 2022

Related U.S. Application Data

(63) Continuation of application No. 16/942,389, filed on Jul. 29, 2020, now Pat. No. 11,411,017.

(30) Foreign Application Priority Data

Feb. 28, 2020 (KR) ..................... 10-2020-0025559

(51) Int. Cl.
*H10B 43/35* (2023.01)
*H10B 41/27* (2023.01)
*H10B 41/35* (2023.01)
*H10B 43/27* (2023.01)

(52) U.S. Cl.
CPC ............ *H10B 43/35* (2023.02); *H10B 41/27* (2023.02); *H10B 41/35* (2023.02); *H10B 43/27* (2023.02)

(58) Field of Classification Search
None
See application file for complete search history.

(56) References Cited

U.S. PATENT DOCUMENTS 9,343,469 B2    5/2016  Sun et al.
2010/0314678 A1* 12/2010 Lim ....................... H10B 43/20
                                                    257/314
2021/0091102 A1* 3/2021 Zhu .................. H01L 21/76802
(Continued)

FOREIGN PATENT DOCUMENTS

KR   1020170000462 A   1/2017
KR   1020170090183 A   8/2017

OTHER PUBLICATIONS

Afzal Khan et al., Direct CVD Growth of Graphene on Technologically Important Dielectric and Semiconducting Substrates, Adv. Sci. 2018, 5, 1800050, vol. 5, Issue 11, Nov. 2018, 1800050, 2018 WILEY-VCH Verlag GmbH & Co. KGaA, Weinheim.

(Continued)

*Primary Examiner* — Hsien Ming Lee
(74) *Attorney, Agent, or Firm* — WILLIAM PARK & ASSOCIATES LTD.

(57) ABSTRACT

A semiconductor device includes: a stack structure including gate patterns and insulating patterns; a channel layer penetrating the stack structure; a memory layer penetrating the stack structure, the memory layer surrounding the channel layer; and a select transistor connected to the channel layer. The select transistor includes: a carbon layer Schottky-joined with the channel layer; a select gate spaced apart from the carbon layer; and a gate insulating layer between the select gate and the carbon layer.

10 Claims, 22 Drawing Sheets

(56) References Cited

U.S. PATENT DOCUMENTS

2021/0143285 A1   5/2021   Lee et al.

OTHER PUBLICATIONS

Heejun Yang et al., Graphene Barristor, a Triode Device with a Gate-Controlled Schottky Barrier, May 17, 2012, pp. 1140-1143, Science(6085) vol. 336, American Association for the Advancement of Science, 1200 New York Avenue NW, Washington, DC 20005.
Joo Song Lee et al., Wafer-scale single-crystal hexagonal boron nitride film via self-collimated grain formation, Science vol. 362, pp. 817-821 (2018), Nov. 16, 2018, American Association for the Advancement of Science, 1200 New York Avenue NW, Washington, DC 20005.
K.S. Novoselov et al., Two-dimensional gas of massless Dirac fermions in graphene, Nov. 10, 2005, Nature 438, pp. 197-200(2005), https://doi.org/10.1038/nature04233.
René H.J. Vervuurt et al., Atomic Layer Deposition for Graphene Device Integration, Adv. Mater. Interfaces 2017 vol. 4, Issue 18, Special Issue: Advances in Chemical Vapor Deposition, Sep. 22, 2017, WILEY-VCH Verlag GmbH & Co. KGaA, Weinheim.

\* cited by examiner

SEMICONDUCTOR DEVICE AND MANUFACTURING METHOD OF SEMICONDUCTOR DEVICE

CROSS-REFERENCE TO RELATED APPLICATION

The present application is a continuation application of U.S. patent application Ser. No. 16/942,389, filed on Jul. 29, 2020, and claims priority under 35 U.S.C. § 119(a) to Korean patent application number 10-2020-0025559, filed on Feb. 28, 2020, in the Korean Intellectual Property Office, the entire disclosure of which is incorporated herein by reference.

BACKGROUND

1. Technical Field

The present disclosure generally relates to a semiconductor device and a manufacturing method of the semiconductor device, and more particularly, to a three-dimensional semiconductor device and a manufacturing method of the three-dimensional semiconductor device.

2. Related Art

A semiconductor device includes an integrated circuit configured with a Metal Oxide Semiconductor Field Effect Transistor (MOSFET). As the size and design rule of the semiconductor device are gradually reduced, scaling down of MOSFETs is gradually accelerated.

The scaling down of the MOSFETs may cause a short channel effect, etc., and therefore, operational characteristics of the semiconductor device may be deteriorated. Accordingly, there have been researched various method for forming a semiconductor device having better performance while overcoming a limitation due to high integration of the semiconductor device.

Further, such an integration circuit pursues operational reliability and low power consumption. Thus, there has been researched a method for forming a device which has higher reliability and lower power consumption in a smaller space.

SUMMARY

In accordance with an aspect of the present disclosure, there may be provided a semiconductor device including: a stack structure including gate patterns and insulating patterns; a channel layer penetrating the stack structure; a memory layer penetrating the stack structure, the memory layer surrounding the channel layer; and a select transistor connected to the channel layer, wherein the select transistor includes: a carbon layer Schottky-joined with the channel layer; a select gate spaced apart from the carbon layer; and a gate insulating layer between the select gate and the carbon layer.

In accordance with another aspect of the present disclosure, there may be provided a semiconductor device including: a stack structure including gate patterns and insulating patterns; a source layer spaced apart from the stack structure; a channel layer penetrating the stack structure; a memory layer penetrating the stack structure, the memory layer surrounding the channel layer; and a select transistor between the stack structure and the source layer, wherein the select transistor includes: a carbon layer in contact with the source layer and the channel layer; a select gate spaced apart from the carbon layer; and a gate insulating layer between the select gate and the carbon layer.

In accordance with still another aspect of the present disclosure, there may be provided a semiconductor device including: a stack structure including gate patterns and insulating patterns; a conductor spaced apart from the stack structure; a channel layer penetrating the stack structure; a memory layer penetrating the stack structure, the memory layer surrounding the channel layer; and a select transistor between the stack structure and the conductor, wherein the select transistor includes: a carbon layer in contact with the conductor and the channel layer; a select gate spaced apart from the carbon layer; and a gate insulating layer between the select gate and the carbon layer.

In accordance with still another aspect of the present disclosure, there may be provided a method of manufacturing a semiconductor device, the method including: forming a first preliminary select transistor; forming a first carbon layer penetrating the first preliminary select transistor; forming a stack structure on the first preliminary select transistor; and forming a channel layer penetrating the stack structure, the channel layer being Schottky-joined with the first carbon layer.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor device capable of improving operational reliability and a manufacturing method of the semiconductor device.

Figure 1A:
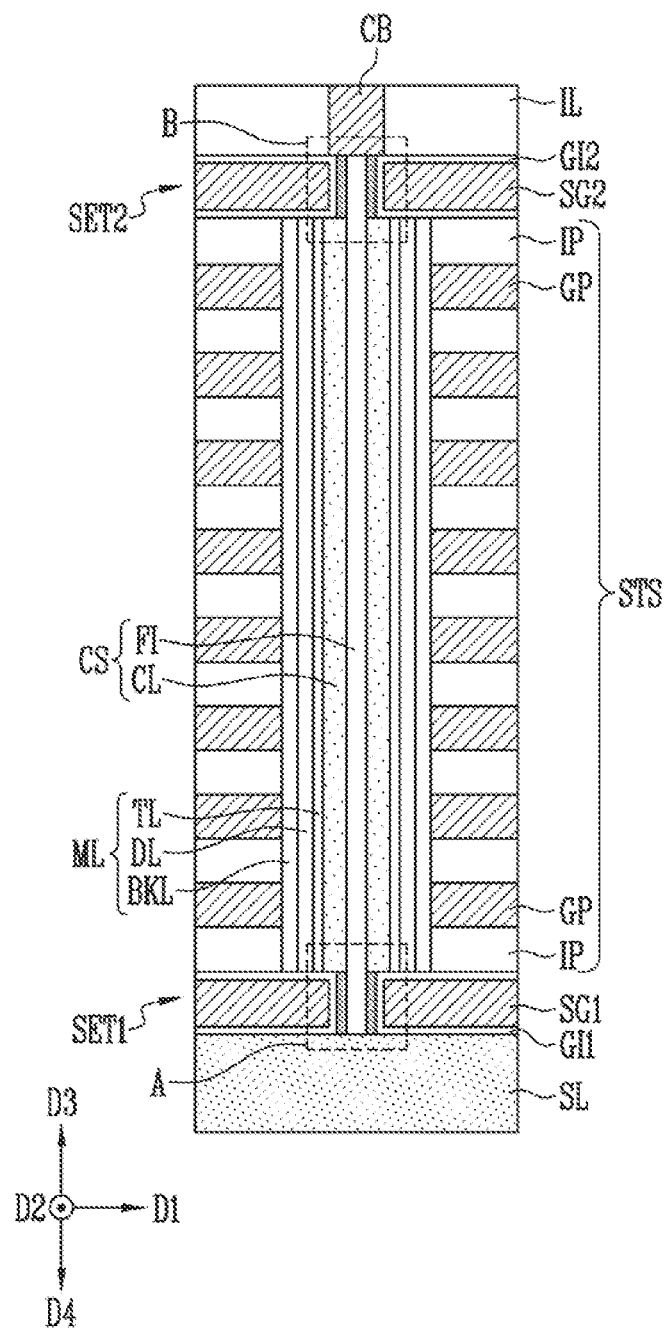
FIG. 1A is a sectional view of a semiconductor device in accordance with embodiments of the present disclosure.
Figure 1B:
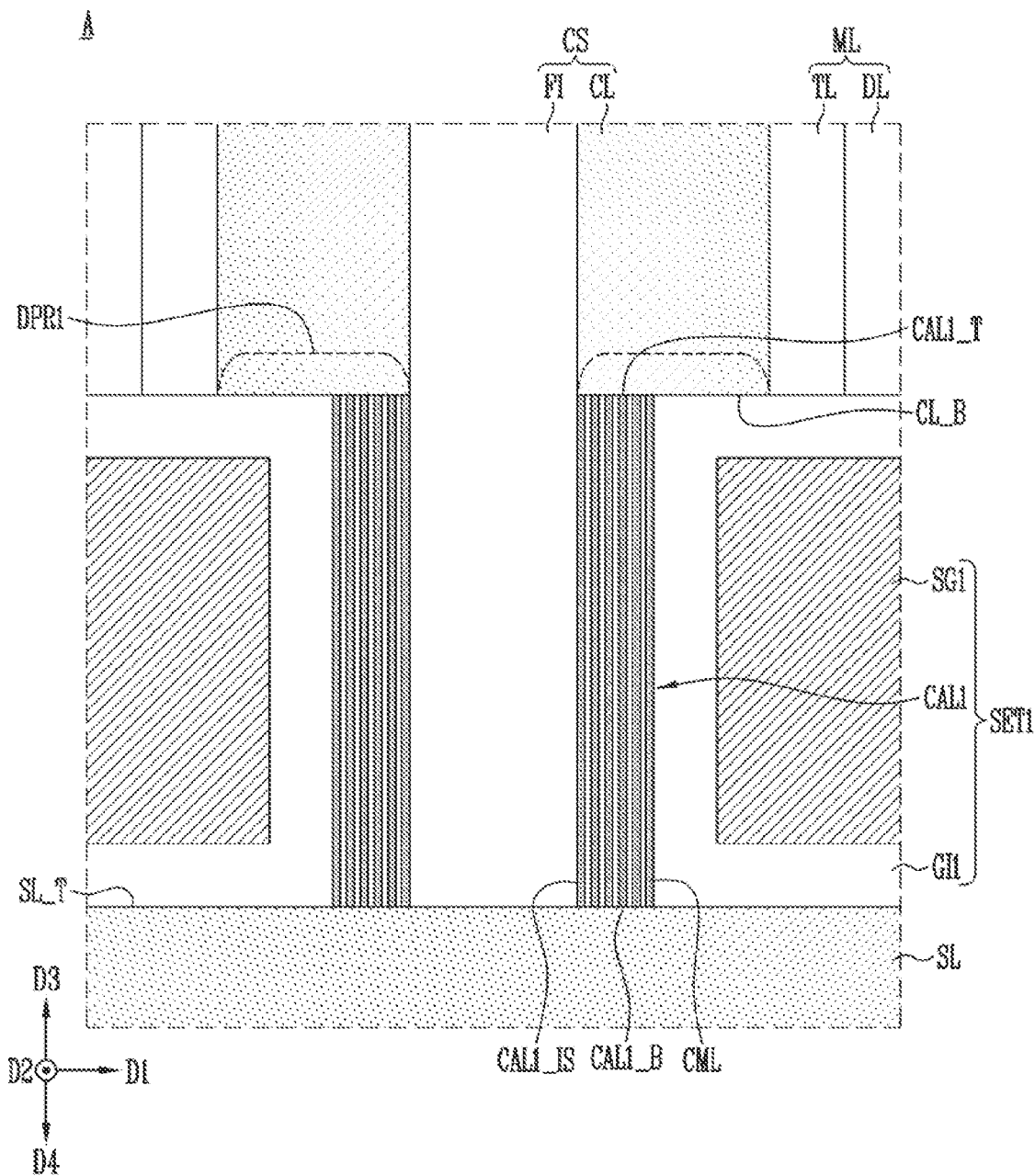
FIG. 1B is an enlarged view of region A shown in FIG. 1A.
Figure 1C:
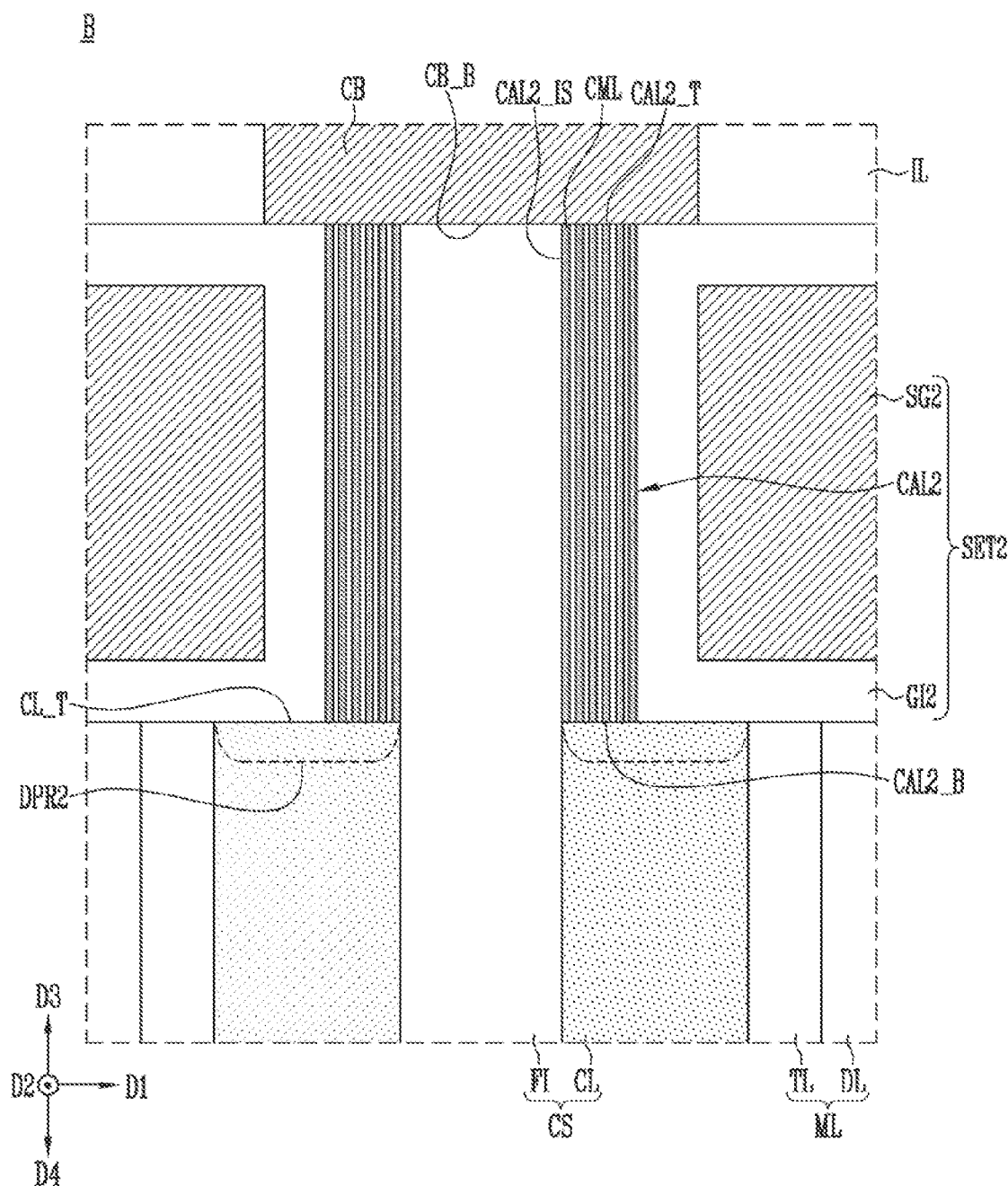
FIG. 1C is an enlarged view of region B shown in FIG. 1A.

FIG. 1A is a sectional view of a semiconductor device in accordance with embodiments of the present disclosure. FIG. 1B is an enlarged view of region A shown in FIG. 1A. FIG. 1C is an enlarged view of region B shown in FIG. 1A.

Referring to FIG. 1A, the semiconductor device in accordance with the embodiments of the present disclosure may include a source layer SL.

The source layer SL may be used as a source line of the semiconductor device. The source layer SL may have the shape of a plate expanding along a plane defined by a first direction D1 and a second direction D2. The first direction D1 and the second direction D2 may intersect each other. In an example, the first direction D1 and the second direction D2 may be perpendicular to each other. The source layer SL may include a semiconductor material. In an example, the source layer SL may include poly-silicon.

A first select transistor SET1 may be provided on the source layer SL. The first select transistor SET1 may be a switching element. The first select transistor SET1 may electrically connect or disconnect a channel layer CL and the source layer SL, which will be described later, through a switching operation. The first select transistor SET1 may be used as a source select transistor.

A stack structure STS may be provided on the first select transistor SET1. The stack structure STS may include gate patterns GP and insulating patterns IP, which are alternately stacked in a third direction D3. The third direction D3 may intersect the first direction D1 and the second direction D2. In an example, the third direction D3 may be perpendicular to the first direction D1 and the second direction D2. A lowermost insulating pattern IP of the stack structure STS may be in contact with the first select transistor SET1. The stack structure STS may be spaced apart from the source layer SL. The first select transistor SET1 may be provided between the stack structure STS and the source layer SL.

The insulating patterns IP may include an insulating material. In an example, the insulating patterns IP may include oxide.

The gate pattern GP may include a gate conductive layer. In an example, the gate conductive layer may include at least one of a doped silicon layer, a metal silicide layer, and a metal. In an example, the metal may include at least one of tungsten, nickel, and cobalt. The gate conductive layer may be used as a word line connected to a memory cell of the semiconductor device. The gate pattern GP may further include a barrier layer surrounding the gate conductive layer. In an example, the barrier layer may include at least one of titanium nitride and tantalum nitride.

A second select transistor SET2 may be provided on the stack structure STS. The second select transistor SET2 may be a switching element. The second select transistor SET2 may electrically connect or disconnect the channel layer CL and a conductor CB, which will be described later, through a switching operation. The second select transistor SET2 may be used as a drain select transistor. An uppermost insulating pattern IP of the stack structure STS may be in contact with the second select transistor SET2.

A channel structure CS may be provided, which penetrates the stack structure STS, the first select transistor SET1, and the second select transistor SET2. The channel structure CS may extend in the third direction D3. The channel structure CS may include a filling layer FI and the channel layer CL surrounding an outer sidewall of the filling layer FI.

The filling layer FI may penetrate stack structure STS, the first select transistor SET1, and the second select transistor SET2. The filling layer FI may extend in the third direction D3. The filling layer FI may be in contact with the source layer SL. The filling layer FI may be in contact with the conductor CB which will be described later. The filling layer FI may include an insulating material. In an example, the filling layer FI may include oxide.

The channel layer CL may penetrate the stack structure STS. The channel layer CL may extend in the third direction D3. The channel layer CL may be connected to the first select transistor SET1. The channel layer CL may be connected to the second select transistor SET2. The channel layer CL may include a semiconductor material. In an example, the channel layer CL may include poly-silicon.

A memory layer ML may be provided, which penetrates the stack structure STS. The memory layer ML may surround an outer sidewall of the channel structure CS. The memory layer ML may surround the channel layer CL. The memory layer ML may extend in the third direction D3. The memory layer ML may be disposed between the channel structure CS and the stack structure STS.

The memory layer ML may include a tunnel insulating layer TL surrounding an outer sidewall of the channel layer CL, a data storage layer DL surrounding an outer sidewall of the tunnel insulating layer TL, and a blocking layer BKL surrounding an outer sidewall of the data storage layer DL. The tunnel insulating layer TL, the data storage layer DL, and the blocking layer BKL may extend in the third direction D3.

The tunnel insulating layer TL may include a material through which charges can tunnel. In an example, the tunnel insulating layer TL may include oxide. In an example, the data storage layer DL may include nitride in which charges can be trapped. The material which the data storage layer DL includes is not limited to the nitride, and may be variously changed depending on a data storage method. In example, the data storage layer DL may include silicon, a phase change material, or nano dots. The blocking layer BKL may include a material capable of blocking movement of charges. In an example, the blocking layer BKL may include oxide. In an example, a thickness of the blocking layer BKL may be greater than that of the tunnel insulating layer TL.

An insulating layer IL may be provided on the second select transistor SET2. The insulating layer IL may include an insulating material. In an example, the insulating layer IL may include oxide.

The conductor CB may be provided in the insulating layer IL. In an example, the conductor CB may be used as a bit line of the semiconductor device. In another example, the conductor CB may be used as a conductive line electrically connected to the bit line of the semiconductor device. The conductor CB may include a conductive material. In an example, the conductor CB may include copper, tungsten or aluminum. The conductor CB may be spaced apart from the stack structure STS. The second select transistor SET2 may be provided between the conductor CB and the stack structure STS.

Referring to FIG. 1B, the first select transistor SET1 may include a first select gate SG1, a first gate insulating layer GI1, and a first carbon layer CAL1.

The first carbon layer CAL1 may surround an outer sidewall of a lowermost portion of the filling layer FI of the channel structure CS. An inner sidewall CAL1_IS of the first carbon layer CAL1 may be in contact with the outer sidewall of the lowermost portion of the filling layer FI of the channel structure CS. A top surface CAL1_T of the first carbon layer CAL1 may be in contact with a bottom surface CL_B of the channel layer CL of the channel structure CS. A bottom surface CAL1_B of the first carbon layer CAL1 may be in contact with a top surface SL_T of the source layer SL.

The first carbon layer CAL1 may be disposed between the source layer SL and the channel layer CL. The first carbon layer CAL1 may connect the source layer SL to the channel layer CL. The first carbon layer CAL1 may be in contact with the source layer SL and the channel layer CL.

The first carbon layer CAL1 may include at least one carbon monolayer CML. In an example, the first carbon layer CAL1 may include one to ten carbon monolayers CML. Although a case where the first carbon layer CAL1 includes six carbon monolayers CML is illustrated in FIG. 1B, the number of carbon monolayers CML of the first carbon layer CAL1 might not be limited to that shown in FIG. 1B. The carbon monolayer CML may have a two-dimensional layer structure. In an example, the carbon monolayer CML may be single layer graphene. The carbon monolayer CML may extend in the third direction D3. The carbon monolayers CML may overlap with each other in the first direction D1.

When the first carbon layer CAL1 includes a plurality of carbon monolayers CML, an outer carbon monolayer CML may surround an inner carbon monolayer CML. In an example, the first carbon layer CAL1 may be formed through an atomic layer deposition (ALD) process or a chemical vapor deposition (CVD) process. In an example, a width of the first carbon layer CAL1 in the first direction D1 may be 10 nm to 20 nm.

The first gate insulating layer GI1 may surround the first carbon layer CAL1. The first gate insulating layer GI1 may be in contact with an outer sidewall of the first carbon layer CAL1. The first gate insulating layer GI1 may be in contact with the top surface SL_T of the source layer SL, the bottom surface CL_B of the channel layer CL, and a bottom surface of the memory layer ML. The first gate insulating layer GI1 may include an insulating material. In an example, the first gate insulating layer GI1 may include oxide.

The first select gate SG1 may be surrounded by the first gate insulating layer GI1. The first select gate SG1 may be provided in the first gate insulating layer GI1. The first select gate SG1 may be spaced apart from the first carbon layer CAL1, the source layer SL, the channel layer CL, and the memory layer ML. The first gate insulating layer GI1 may be provided between the first select gate SG1 and the first carbon layer CAL1. The first select gate SG1 may include a conductive material. In an example, the first select gate SG1 may include at least one of a doped silicon layer, a metal silicide layer, tungsten, nickel, and cobalt.

The channel layer CL may include a first doping region DPR1 in contact with the first carbon layer CAL1 of the first select transistor SET1. A dopant may be doped in the first doping region DPR1. In an example, an n-type dopant may be doped in the first doping region DPR1.

Referring to FIG. 1C, the second select transistor SET2 may include a second select gate SG2, a second gate insulating layer GI2, and a second carbon layer CAL2.

The second carbon layer CAL2 may surround an outer sidewall of an uppermost portion of the filling layer FI of the channel structure CS. An inner sidewall CAL2_IS of the second carbon layer CAL2 may be in contact with the outer sidewall of the uppermost portion of the filling layer FI of the channel structure CS. A top surface CAL2_T of the second carbon layer CAL2 may be in contact with a bottom surface CB_B of the conductor CB. A bottom surface CAL2_B of the second carbon layer CAL2 may be in contact with a top surface CL_T of the channel layer CL of the channel structure CS.

The second carbon layer CAL2 may be disposed between the conductor CB and the channel layer CL. The second carbon layer CAL2 may connect the conductor CB and the channel layer CL to each other. The second carbon layer CAL2 may be in contact with the conductor CB and the channel layer CL.

The second carbon layer CAL2 may include at least one carbon monolayer CML. In an example, the second carbon layer CAL2 may include one to ten carbon monolayers CML. Although a case where the second carbon layer CAL2 includes six carbon monolayers CML is illustrated in FIG. 1C, the number of carbon monolayers CML of the second carbon layer CAL2 might not be limited to that shown in FIG. 1C. The carbon monolayer CML may have a two-dimensional layer structure. In an example, the carbon monolayer CML may be single layer graphene. The carbon monolayer CML may extend in the third direction D3. The carbon monolayers CML may overlap with each other in the first direction D1.

When the second carbon layer CAL2 includes a plurality of carbon monolayers CML, an outer carbon monolayer CML may surround an inner carbon monolayer CML. In an example, the second carbon layer CAL2 may be formed through an ALD process or a CVD process. In an example, a width of the second carbon layer CAL2 in the first direction D1 may be 10 nm to 20 nm.

The second gate insulating layer GI2 may surround the second carbon layer CAL2. The second gate insulating layer GI2 may be in contact with an outer sidewall of the second carbon layer CAL2. The second gate insulating layer GI2 may be in contact with the bottom surface of the conductor CB, the top surface CL_T of the channel layer CL, and a top surface of the memory layer ML. The second gate insulating layer GI2 may include an insulating material. In an example, the second gate insulating layer GI2 may include oxide.

The second select gate SG2 may be surrounded by the second gate insulating layer GI2. The second select gate SG2 may be provided in the second gate insulating layer GI2. The second select gate SG2 may be spaced apart from the second carbon layer CAL2, the conductor CB, the channel layer CL, and the memory layer ML. The second gate insulating layer GI2 may be provided between the second select gate SG2 and the second carbon layer CAL2. The second select gate SG2 may include a conductive material. In an example, the second select gate SG2 may include at least one of a doped silicon layer, a metal silicide layer, tungsten, nickel, and cobalt.

The channel layer CL may include a second doping region DPR2 in contact with the second select transistor SET2 and the second carbon layer CAL2. A dopant may be doped in the second doping region DPR2. In an example, an n-type dopant may be doped in the second doping region DPR2.

The channel layer CL and the first carbon layer CAL1 of the first select transistor SET1 may be Schottky-joined. The channel layer CL and the second carbon layer CAL2 of the second select transistor SET2 may be Schottky-joined.

Figure 2A:
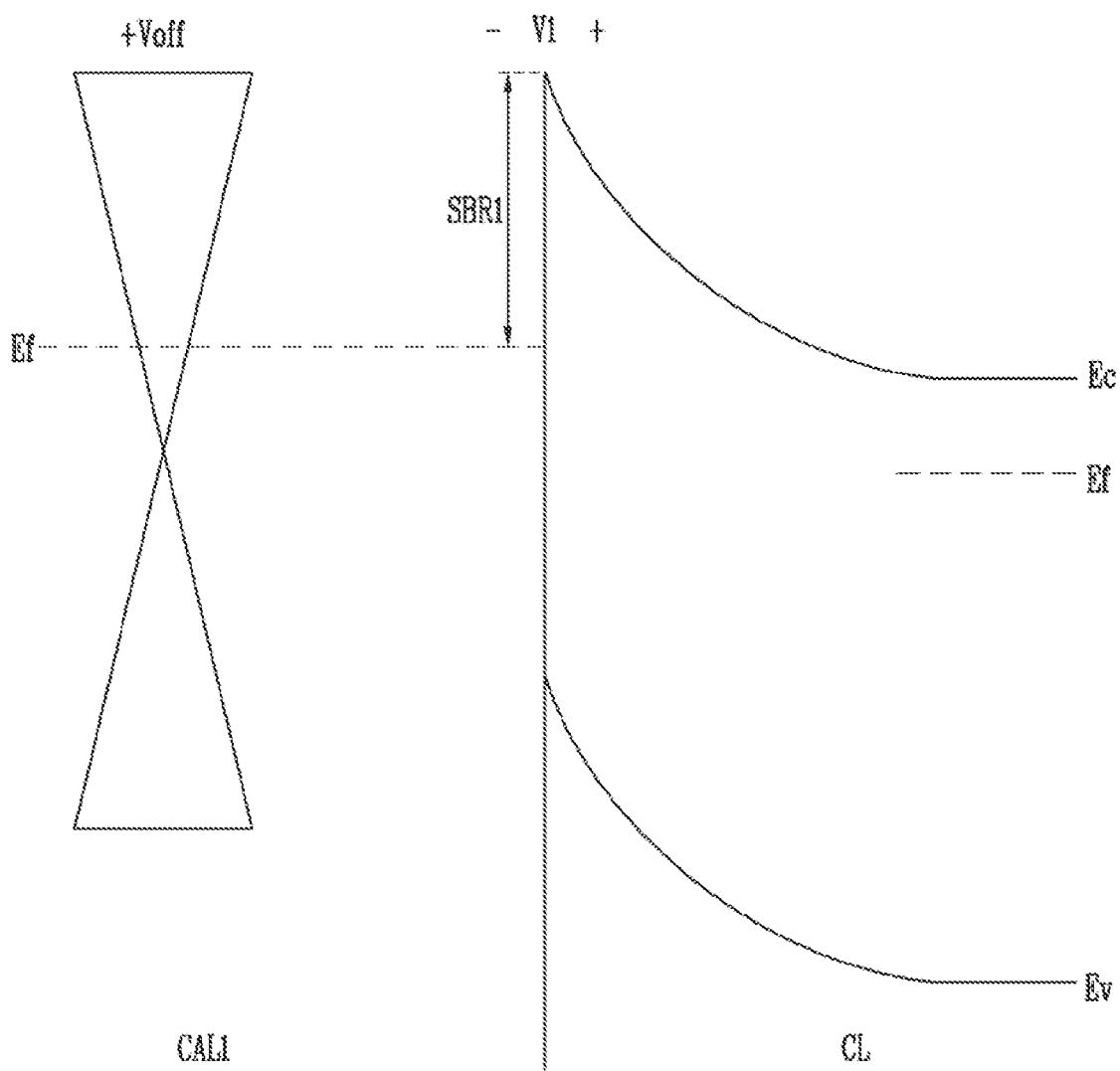
FIGS. 2A and 2B are band diagrams illustrating an operation of the semiconductor device in accordance with the embodiments shown in FIGS. 1A to 1C.
Figure 2B:
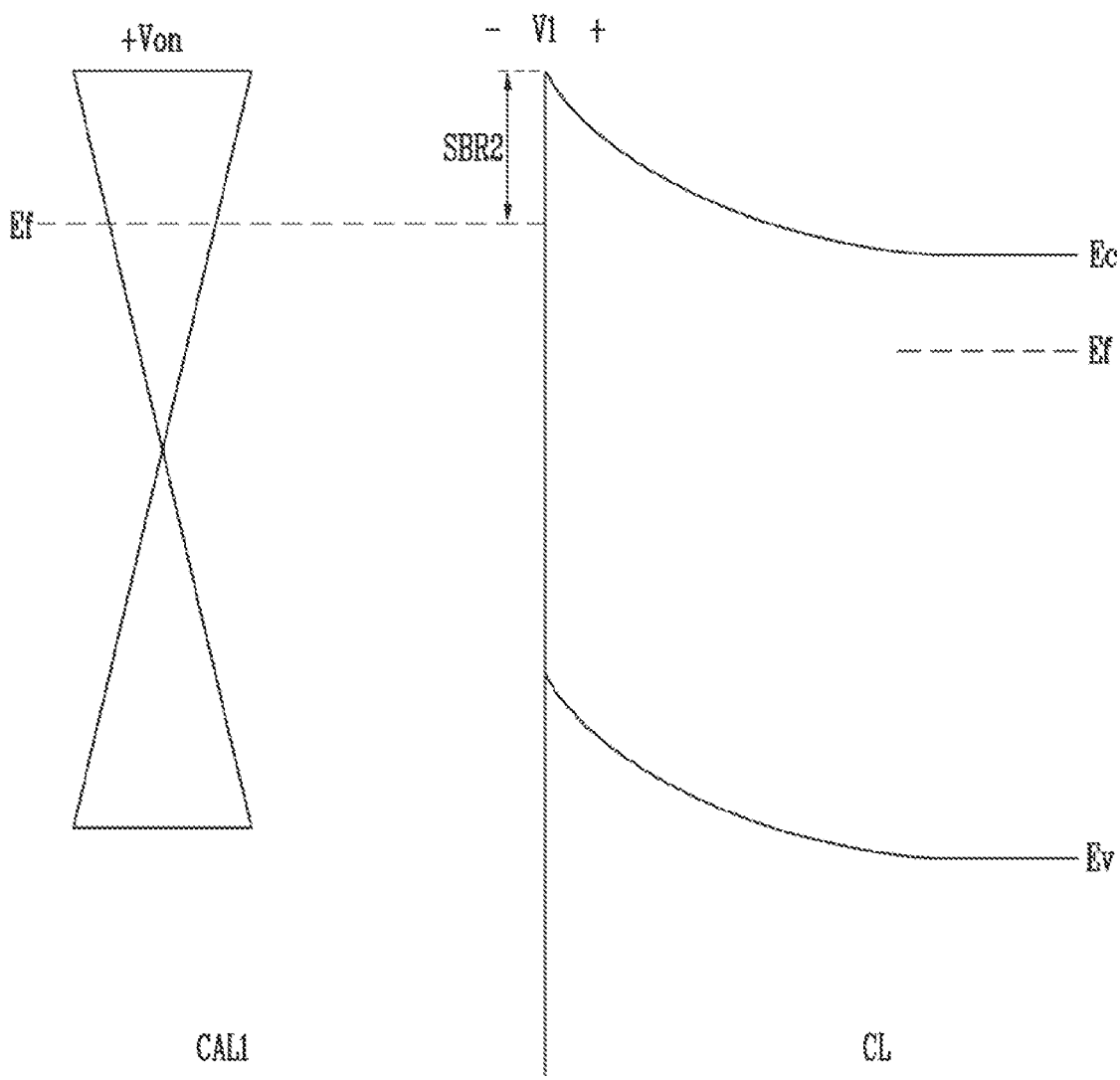

FIGS. 2A and 2B are band diagrams illustrating an operation of the semiconductor device in accordance with the embodiments shown in FIGS. 1A to 1C.

In the following description of FIGS. 2A and 2B, an operation of the first carbon layer CAL1, the first select gate SG1, and the channel layer CL in accordance with the embodiments shown in FIGS. 1A to 1C is described as one example. An operation of the second carbon layer CAL2, the second select gate SG2, and the channel layer CL in accordance with the embodiments shown in FIGS. 1A to 1C may be similar to that of the first carbon layer CAL1, the first select gate SG1, and the channel layer CL.

FIG. 2A illustrates an energy band diagram of the first carbon layer CAL1 and the channel layer CL, in a state in which a turn-off voltage Voff as a positive voltage is applied to the first select gate SG1 and a first voltage V1 is applied between the channel layer CL and the first carbon layer CAL1. FIG. 2B illustrates an energy band diagram of the first carbon layer CAL1 and the channel layer CL, in a state in which a turn-on voltage Von is applied to the first select gate SG1 and the first voltage V1 is applied between the channel layer CL and the first carbon layer CAL1. In FIGS. 2A and 2B, Ev shows energy profile of valence band, Ec shows energy profile of conduction band, and Ef shows energy profile of fermi level.

Referring to FIG. 2A, the first carbon layer CAL1 and the channel layer CL may be Schottky-joined. Since the first carbon layer CAL1 and the channel layer CL are Schottky-joined, a Schottky barrier may be formed between the first carbon layer CAL1 and the channel layer CL.

The turn-off voltage Voff as the positive voltage may be applied to the first select gate SG1. Since the turn-off voltage Voff is applied to the first select gate SG1, a Schottky barrier SBR1 may be formed between the first carbon layer CAL1 and the channel layer CL. The turn-off voltage Voff may have a relatively small magnitude, and the first Schottky barrier SBR1 may be relatively large.

When the first voltage V1 is applied between the channel layer CL and the first carbon layer CAL1 in a state in which the first Schottky barrier SBR1 is formed, no current may flow due to the first Schottky barrier SBR1. The first voltage V1 may be a reverse voltage for the Schottky junction of the first carbon layer CAL1 and the channel layer CL. The flow of current in a fourth direction D4 (see FIGS. 1A to 1C) may be blocked by the first Schottky barrier SBR1 between the first carbon layer CAL1 and the channel layer CL. In other words, no current may flow from the channel layer CL to the first carbon layer CAL1. The fourth direction D4 may be the opposite direction of the third direction D3.

Referring to FIG. 2B, the turn-on voltage Von as a positive voltage may be applied to the first select gate SG1. The turn-on voltage Von may have a relatively large magnitude. The magnitude of the turn-on voltage Von may be greater than that of the turn-off voltage Voff. Since the turn-on voltage Von is applied to the first select gate SG1, a second Schottky barrier SBR2 may be formed between the first carbon layer CAL1 and the channel layer CL. The second Schottky barrier SBR2 may be relatively small. The second Schottky barrier SBR2 may be smaller than the first Schottky barrier SBR1.

When the first voltage V1 is applied between the channel layer CL and the first carbon layer CAL1 in a state in which the second Schottky barrier SBR2 is formed, a current may flow over the second Schottky barrier SBR2. Since the second Schottky barrier SBR2 is smaller than the first Schottky barrier SBR1, the current may flow in the fourth direction D4 even when the same first voltage V1 as described in FIG. 2A is applied. In other words, the current may flow from the channel layer CL to the first carbon layer CAL1.

As described above, a voltage applied to the first select gate SG1 is controlled as the turn-off voltage Voff or the turn-on voltage Von, so that the flow of current between the first carbon layer CAL1 and the channel layer CL can be controlled. In other words, the first select transistor SET1 may be controlled such that the current flows in the fourth direction D4, and be controlled such that the current does not flow in the fourth direction D4.

The second select transistor SET2 and the channel layer may operate, similarly to the operation of the first select transistor SET1 and the channel layer CL, which is described above.

The second carbon layer CAL2 and the channel layer CL may be Schottky-joined. The size of a Schottky barrier between the second carbon layer CAL2 and the channel layer CL may be controlled by controlling a voltage applied to the second select gate SG2. When a reverse voltage is applied with respect to the Schottky junction of the second carbon layer CAL2 and the channel layer CL, the flow of current between the second carbon layer CAL2 and the channel layer CL may be controlled by controlling the size of the Schottky barrier between the second carbon layer CAL2 and the channel layer CL. In other words, the second select transistor SET2 may be controlled such that the current flows in the third direction D3, and be controlled such that the current does not flow in the third direction D3.

The flow of current between the conductor CB and the source layer SL may be controlled by controlling the first select transistor SET1 and the second select transistor SET2.

As described above, in the semiconductor device in accordance with these embodiments, the first and second carbon layers CAL1 and CAL2 of the first and second select transistors SET1 and SET2 can be used as switchable channels. Accordingly, the switching speed of the channels of the first and second select transistors SET1 and SET2 can be improved.

Figure 3A:
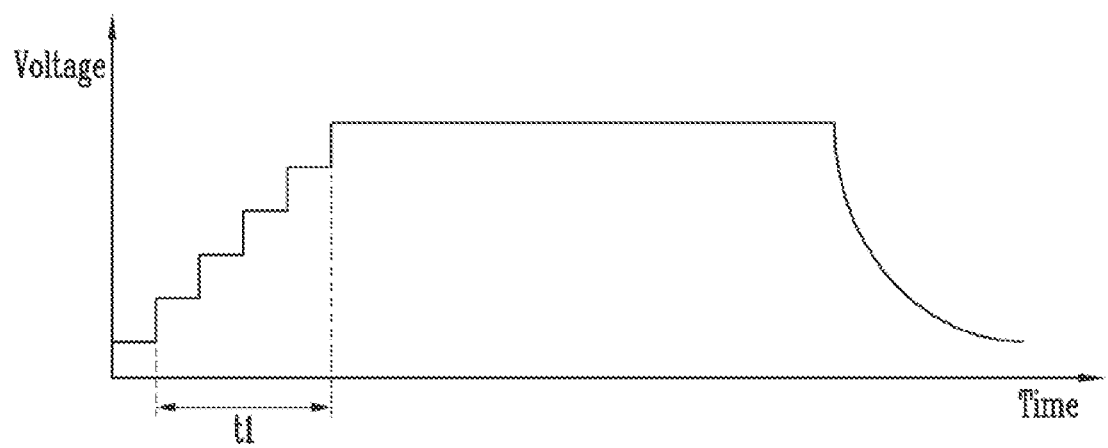
FIGS. 3A and 3B are diagrams for comparing erase operations of a general semiconductor device and the semiconductor device in accordance with the embodiments shown in FIGS. 1A to 1C.
Figure 3B:
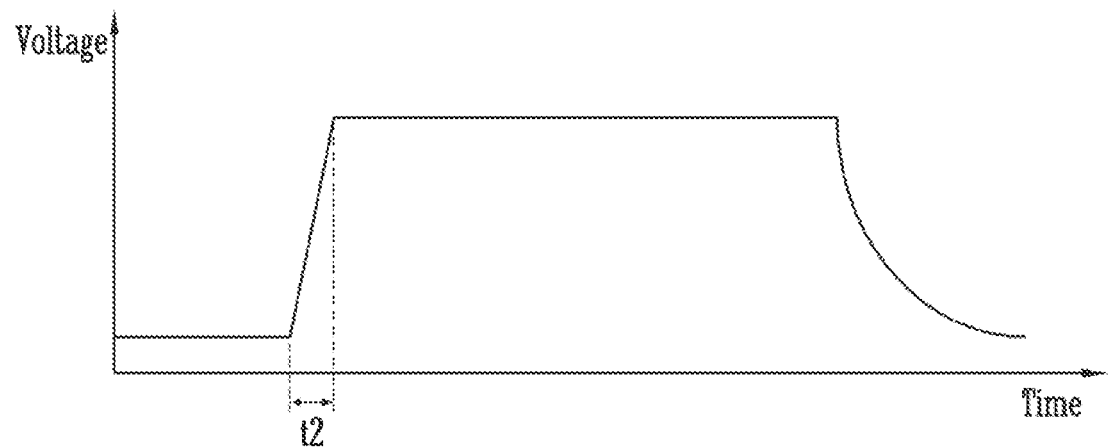

FIGS. 3A and 3B are diagrams for comparing erase operations of a general semiconductor device and the semiconductor device in accordance with the embodiments shown in FIGS. 1A to 1C.

Referring to FIGS. 3A and 3B, in the case of the general semiconductor device (FIG. 3A), a GIDL current may be formed while a voltage is increasing during a first time t1. In the case of the semiconductor device in accordance with the embodiments shown in FIGS. 1A to 1C (FIG. 3B), a GIDL current may be formed while a voltage is increasing during a second time t2 shorter than the first time t1.

As described above, in the semiconductor device in accordance with the embodiments shown in FIGS. 1A to 1C, a carbon layer is used as a channel of a select transistor, so that the switching speed of the channel can be improved. Accordingly, the time required to form a GIDL current can be reduced.

Figure 4A:
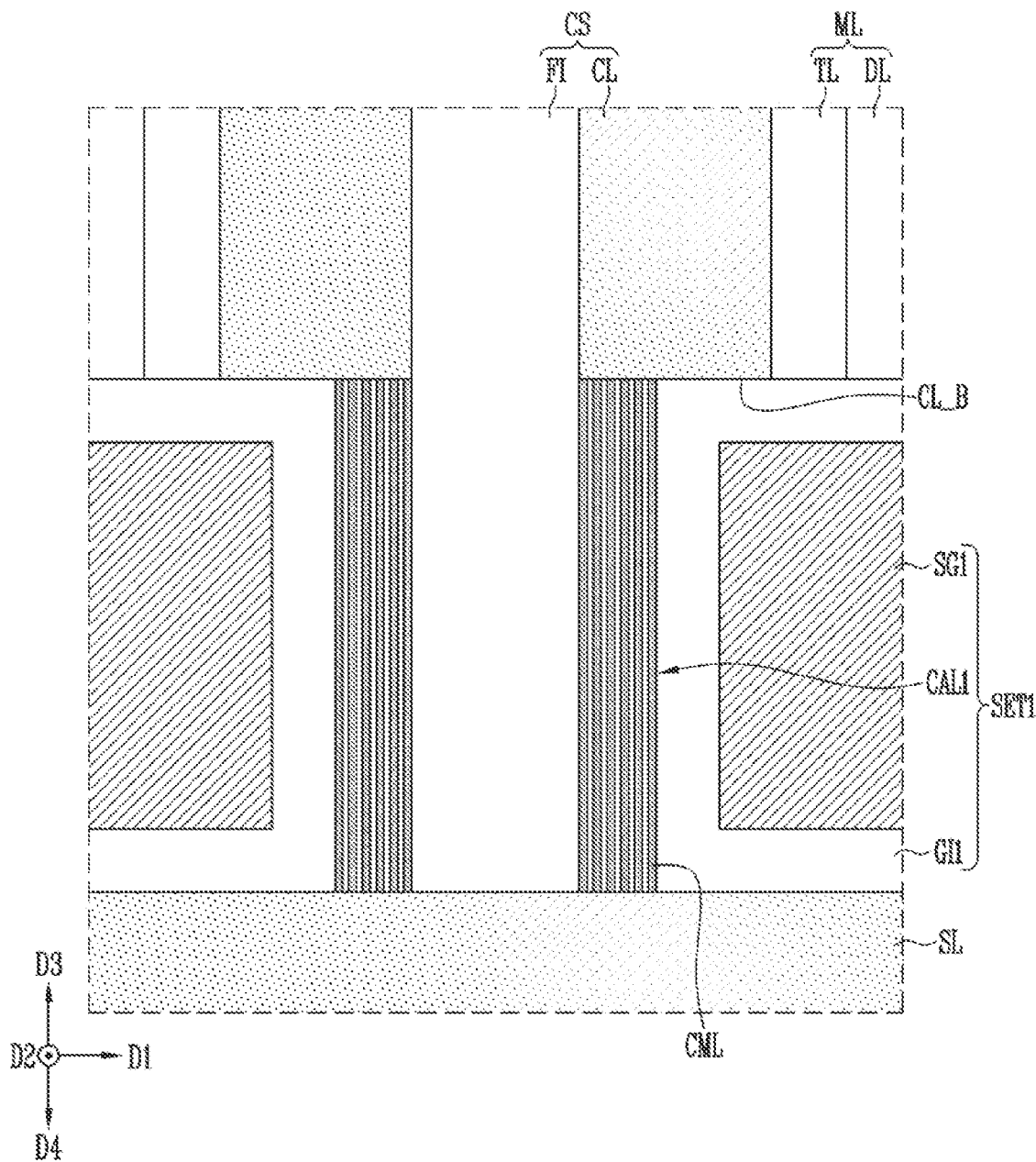
FIGS. 4A and 4B are sectional views of a semiconductor device in accordance with embodiments of the present disclosure.
Figure 4B:
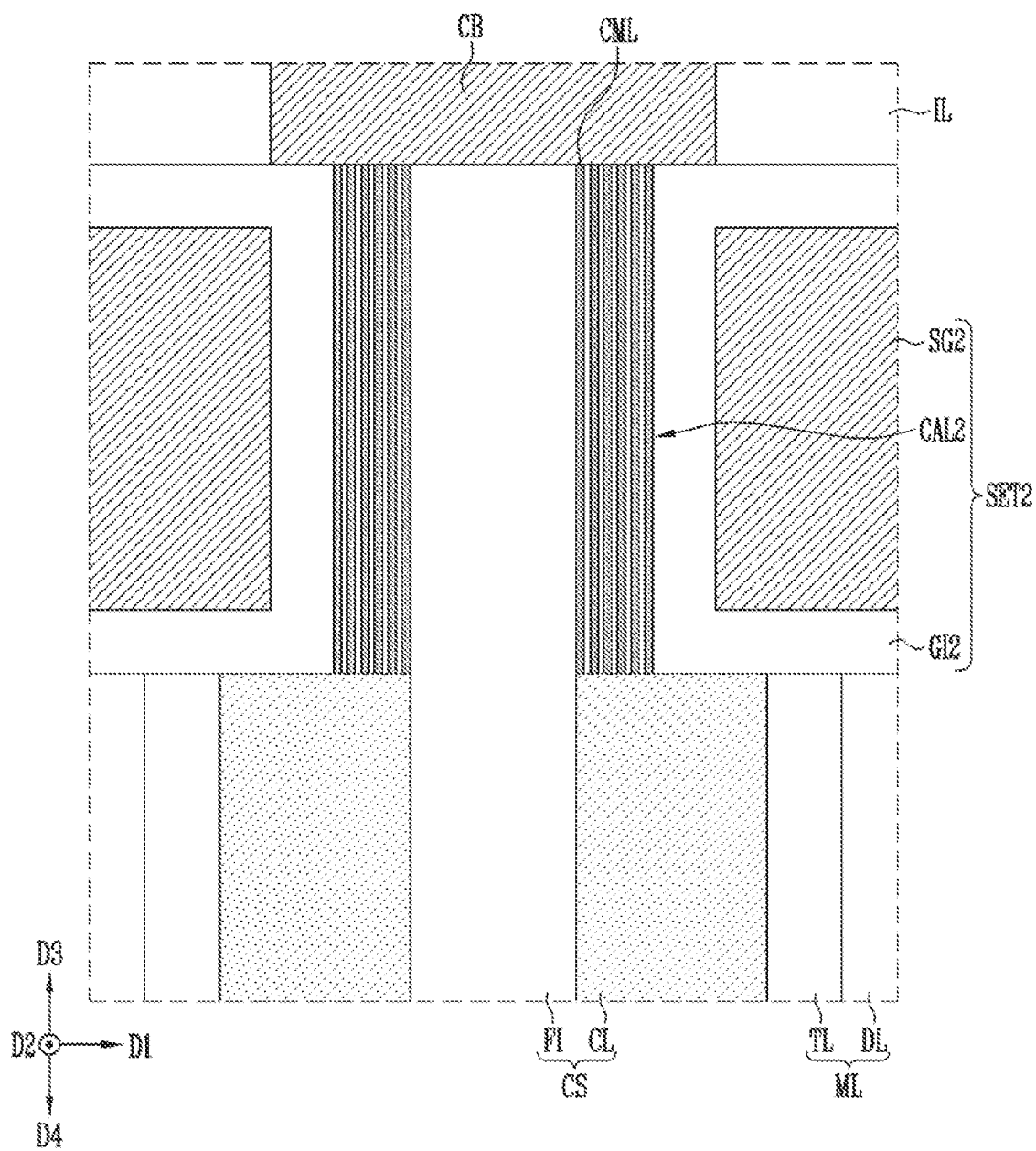

FIGS. 4A and 4B are sectional views of a semiconductor device in accordance with embodiments of the present disclosure.

The semiconductor device in accordance with the embodiments shown in FIGS. 4A and 4B may be similar to the semiconductor device in accordance with the embodiments shown in FIGS. 1A to 1C, except portions described below.

Referring to FIGS. 4A and 4B, in the semiconductor device in accordance with these embodiments, the channel layer CL might not include any doping region. In an example, portions of the channel layer CL, which are in contact with the first carbon layer CAL1 and the second carbon layer CAL2, may be made of an intrinsic semiconductor material.

The channel layer CL and the first carbon layer CAL1 may be Schottky-joined. The channel layer CL and the second carbon layer CAL2 may be Schottky-joined.

In the semiconductor device in accordance with these embodiments, the size of a Schottky barrier between the first carbon layer CAL1 and the channel layer CL may be controlled by controlling a voltage applied to the first select gate SG1, and the size of a Schottky barrier between the second carbon layer CAL2 and the channel layer CL may be controlled by controlling a voltage applied to the second select gate SG2.

When a reverse voltage is applied with respect to the Schottky junction of the first carbon layer CAL1 and the channel layer CL, the flow of current between the first carbon layer CAL1 and the channel layer CL may be controlled by controlling the size of the Schottky barrier between the first carbon layer CAL1 and the channel layer CL. In other words, the first select transistor SET1 may be controlled such that the current flows in the fourth direction D4, and be controlled such that the current does not flow in the fourth direction D4.

When a reverse voltage is applied with respect to the Schottky junction of the second carbon layer CAL2 and the channel layer CL, the flow of current between the second carbon layer CAL2 and the channel layer CL may be controlled by controlling the size of the Schottky barrier between the second carbon layer CAL2 and the channel layer CL. In other words, the second select transistor SET2 may be controlled such that the current flows in the third direction D3, and be controlled such that the current does not flow in the third direction D3.

In the semiconductor device in accordance with these embodiments, the flow of current between the conductor CB and the source layer SL can be controlled by controlling the first select transistor SET1 and the second select transistor SET2.

Figure 5A:
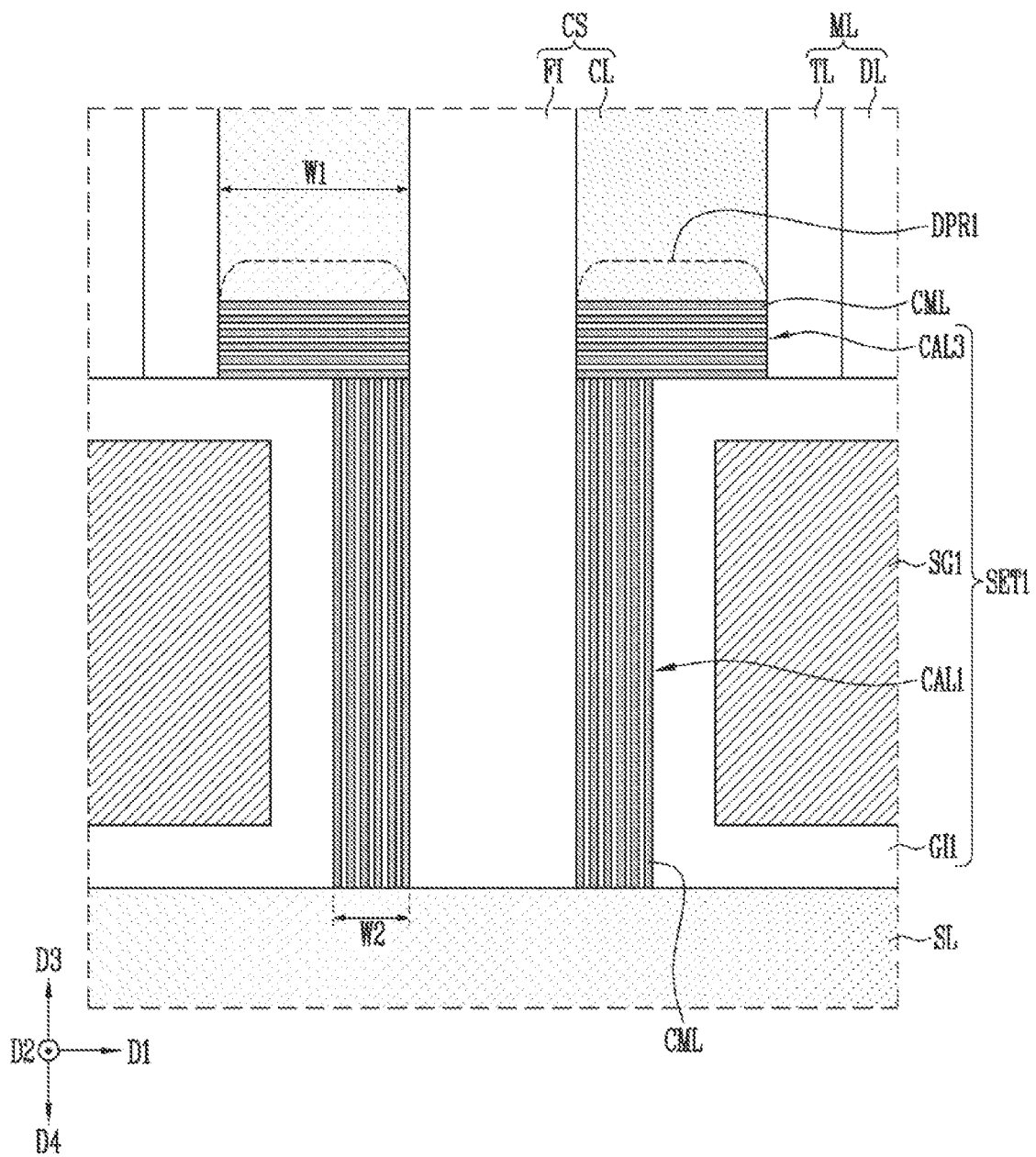
FIGS. 5A and 5B are sectional views of a semiconductor device in accordance with embodiments of the present disclosure.
Figure 5B:
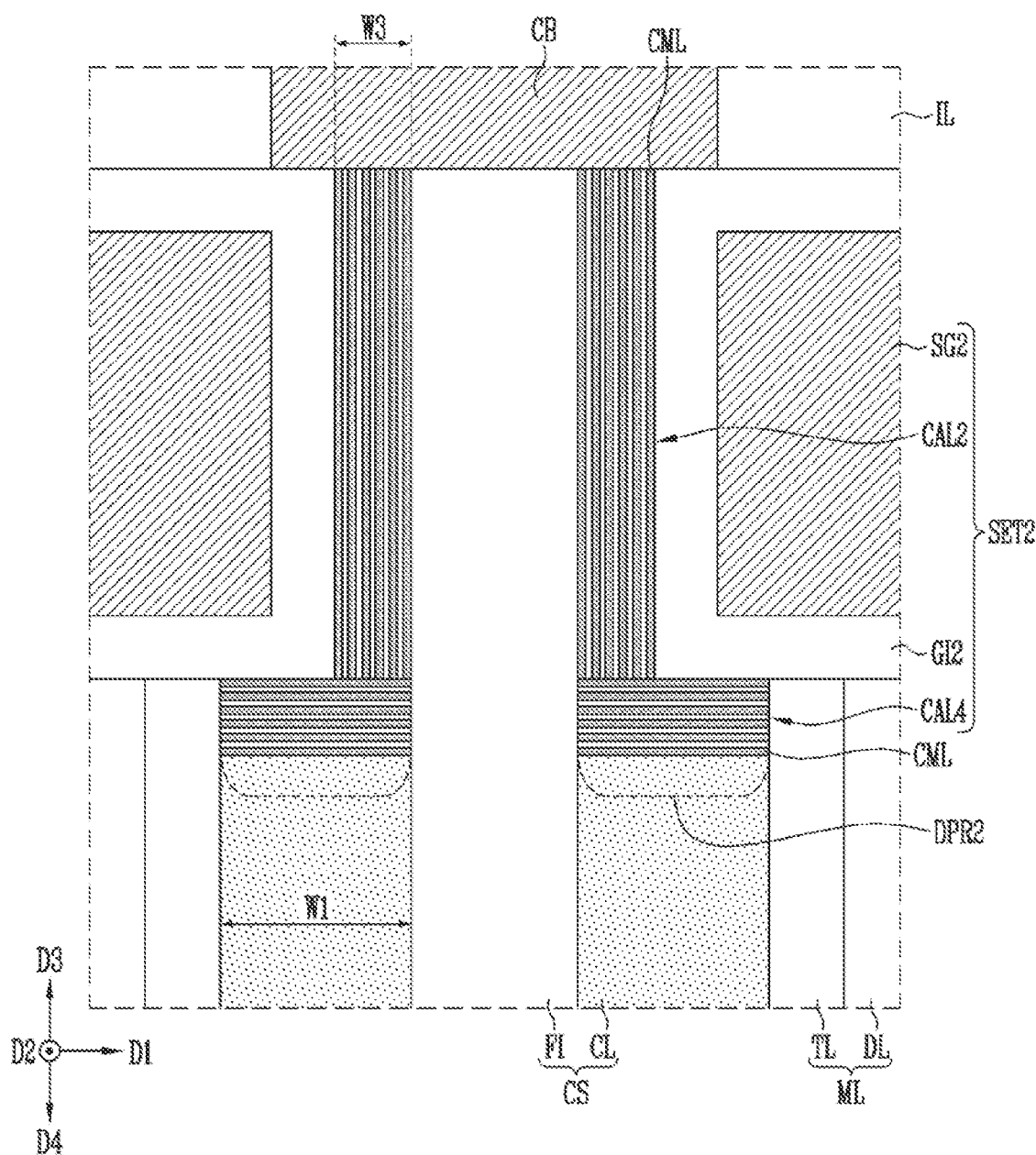

FIGS. 5A and 5B are sectional views of a semiconductor device in accordance with embodiments of the present disclosure.

The semiconductor device in accordance with the embodiments shown in FIGS. 5A and 5B may be similar to the semiconductor device in accordance with the embodiments shown in FIGS. 1A to 1C, except portions described below.

Referring to FIGS. 5A and 5B, the first select transistor SET1 may further include a third carbon layer CAL3, and the second select transistor SET2 may further include a fourth carbon layer CAL4.

The third carbon layer CAL3 may include at least one carbon monolayer CML. In an example, the third carbon layer CAL3 may include one to ten carbon monolayers CML. Although a case where the third carbon layer CAL3 includes six carbon monolayers CML is illustrated in FIG. 5A, the number of carbon monolayers CML of the third carbon layer CAL3 might not be limited to that shown in FIG. 5A. The carbon monolayer CML may have a two-dimensional layer structure. In an example, the carbon monolayer CML may be single layer graphene. The carbon monolayer CML of the third carbon layer CAL3 may extend in the first direction D1. The carbon monolayers CML of the third carbon layer CAL3 may overlap with each other in the third direction D3.

The third carbon layer CAL3 may be provided between the filling layer FI and the memory layer ML. The third carbon layer CAL3 may be provided between the first carbon layer CAL1 and the channel layer CL. The third carbon layer CAL3 may be in contact with the first carbon layer CAL1 and the channel layer CL.

The channel layer CL and the third carbon layer CAL3 may have the same width. The channel layer CL and the third carbon layer CAL3 may have the same width in the first direction. The width of the channel layer CL and the third carbon layer CAL3 in the first direction D1 may be defined as a first width W1.

The first carbon layer CAL1 may have a width smaller than that of the channel layer CL and the third carbon layer CAL3. In an example, the width of the first carbon layer CAL1 in the first direction D1 may be smaller than that of the channel layer CL and the third carbon layer CAL3 in the first direction D1. The width of the first carbon layer CAL1 in the first direction D1 may be defined as a second width W2. The second width W2 may be smaller than the first width W1.

The first doping region DPR1 of the channel layer CL may be in contact with the third carbon layer CAL3.

The fourth carbon layer CAL4 may include at least one carbon monolayer CML. In an example, the fourth carbon layer CAL4 may include one to ten carbon monolayers CML. Although a case where the fourth carbon layer CAL4 includes six carbon monolayers CML is illustrated in FIG. 5B, the number of carbon monolayers CML of the fourth carbon layer CAL4 might not be limited to that shown in FIG. 5B. The carbon monolayer CML may have a two-dimensional layer structure. In an example, the carbon monolayer CML may be single layer graphene. The carbon monolayer CML of the fourth carbon layer CAL4 may extend in the first direction D1. The carbon monolayers CML of the fourth carbon layer CAL4 may overlap with each other in the third direction D3.

The fourth carbon layer CAL4 may be provided between the filling layer FI and the memory layer ML. The fourth carbon layer CAL4 may be provided between the second carbon layer CAL2 and the channel layer CL. The fourth carbon layer CAL4 may be in contact with the second carbon layer CAL2 and the channel layer CL.

The channel layer CL and the fourth carbon layer CAL4 may have the same width. In an example, the channel layer CL and the fourth carbon layer CAL4 may have the same width in the first direction D1. The width of the fourth carbon layer CAL4 in the first direction D1 may be defined as a first width W1.

The second carbon layer CAL2 may have a width smaller than that of the channel layer CL and the fourth carbon layer CAL4. In an example, the width of the second carbon layer CAL2 in the first direction D1 may be smaller than that of the channel layer CL and the fourth carbon layer CAL4 in the first direction D1. The width of the second carbon layer CAL2 in the first direction D1 may be defined as a third width W3. The third width W3 may be smaller than the first width W1.

The second doping region DPR2 of the channel layer CL may be in contact with the fourth carbon layer CAL4.

The channel layer CL and the third carbon layer CAL3 may be Schottky-joined. The channel layer CL and the fourth carbon layer CAL4 may be Schottky-joined.

In the semiconductor device in accordance with these embodiments, the size of a Schottky barrier between the third carbon layer CAL3 and the channel layer CL may be controlled by controlling a voltage applied to the first select gate SG1, and the size of a Schottky barrier between the fourth carbon layer CAL4 and the channel layer CL may be controlled by controlling a voltage applied to the second select gate SG2.

When a reverse voltage may be applied with respect to the Schottky junction of the third carbon layer CAL3 and the channel layer CL, the flow of current between the third carbon layer CAL3 and the channel layer CL may be controlled by controlling the size of the Schottky barrier between the third carbon layer CAL3 and the channel layer CL. In other words, the first select transistor SET1 may be controlled such that the current flows in the fourth direction D4, and be controlled such that the current does not flow in the fourth direction D4.

When a reverse voltage is applied with respect to the Schottky junction of the fourth carbon layer CAL4 and the channel layer CL, the flow of current between the fourth carbon layer CAL4 and the channel layer CL may be controlled by controlling the size of the Schottky barrier between the fourth carbon layer CAL4 and the channel layer CL. In other words, the second select transistor SET2 may be controlled such that the current flows in the third direction D3, and be controlled such that the current does not flow in the third direction D3.

In the semiconductor device in accordance with these embodiments, the flow of current between the conductor CB and the source layer SL can be controlled by controlling the first select transistor SET1 and the second select transistor SET2.

The semiconductor device in accordance with these embodiments include the third carbon layer CAL3 and the fourth carbon layer CAL4, each of which has a relatively wide area contacting with the channel layer CL, so that resistance between the channel layer CL and the third carbon layer CAL3 and resistance between the channel layer CL and the fourth carbon layer CAL4 can be relatively small.

Figure 6A:
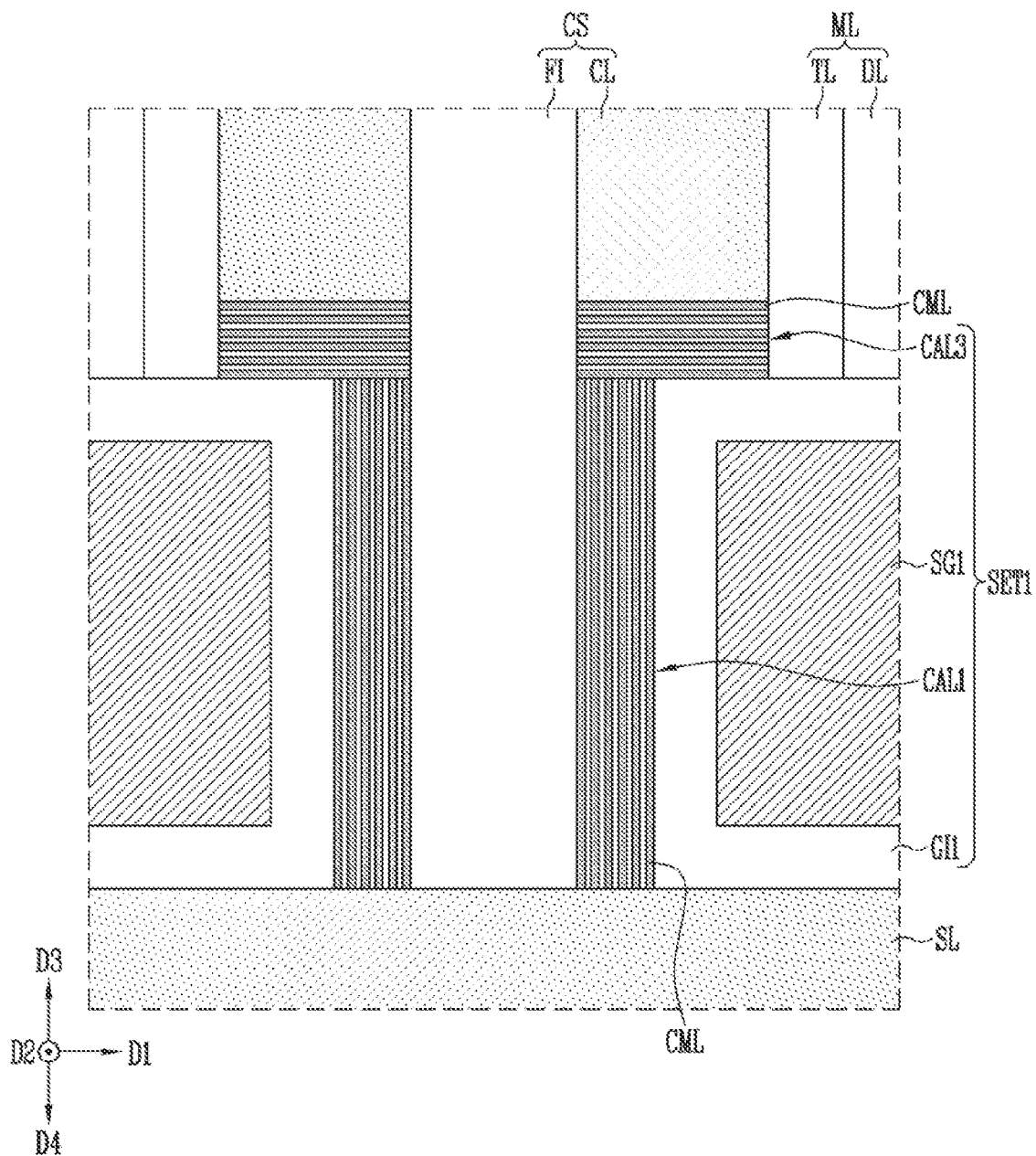
FIGS. 6A and 6B are sectional views of a semiconductor device in accordance with embodiments of the present disclosure.
Figure 6B:
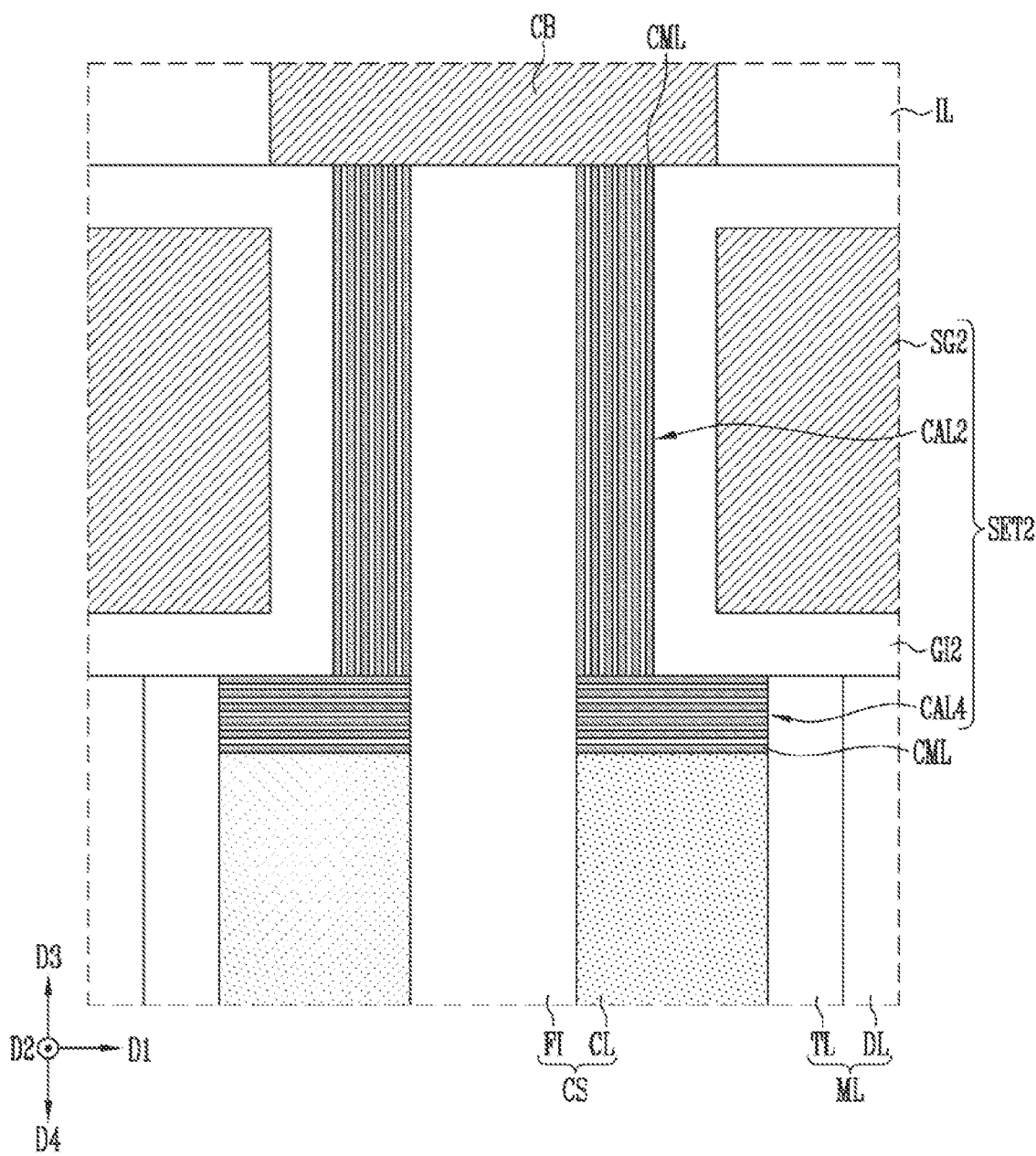

FIGS. 6A and 6B are sectional views of a semiconductor device in accordance with embodiments of the present disclosure.

The semiconductor device in accordance with the embodiments shown in FIGS. 6A and 6B may be similar to the semiconductor device in accordance with the embodiments shown in FIGS. 5A and 5B, except portions described below.

Referring to FIGS. 6A and 6B, in the semiconductor device in accordance with these embodiments, the channel layer CL might not include any doping region. Portions of the channel layer CL, which are in contact with the third carbon layer CAL3 and the fourth carbon layer CAL4, may be made of an intrinsic semiconductor material.

The channel layer CL and the third carbon layer CAL3 may be Schottky-joined. The channel layer CL and the fourth carbon layer CAL4 may be Schottky-joined.

In the semiconductor device in accordance with these embodiments, the size of the Schottky barrier between the third carbon layer CAL3 and the channel layer CL may be controlled by controlling a voltage applied to the first select gate SG1, and the size of the Schottky barrier between the fourth carbon layer CAL4 and the channel layer CL may be controlled by controlling a voltage applied to the second select gate SG2.

In the semiconductor device in accordance with these embodiments, the flow of current between the conductor CB and the source layer SL can be controlled by controlling the first select transistor SET1 and the second select transistor SET2.

The semiconductor device in accordance with these embodiments include the third carbon layer CAL3 and the fourth carbon layer CAL4, each of which has a relatively wide area contacting with the channel layer CL, so that resistance between the channel layer CL and the third carbon layer CAL3 and resistance between the channel layer CL and the fourth carbon layer CAL4 can be relatively small.

Figure 7A:
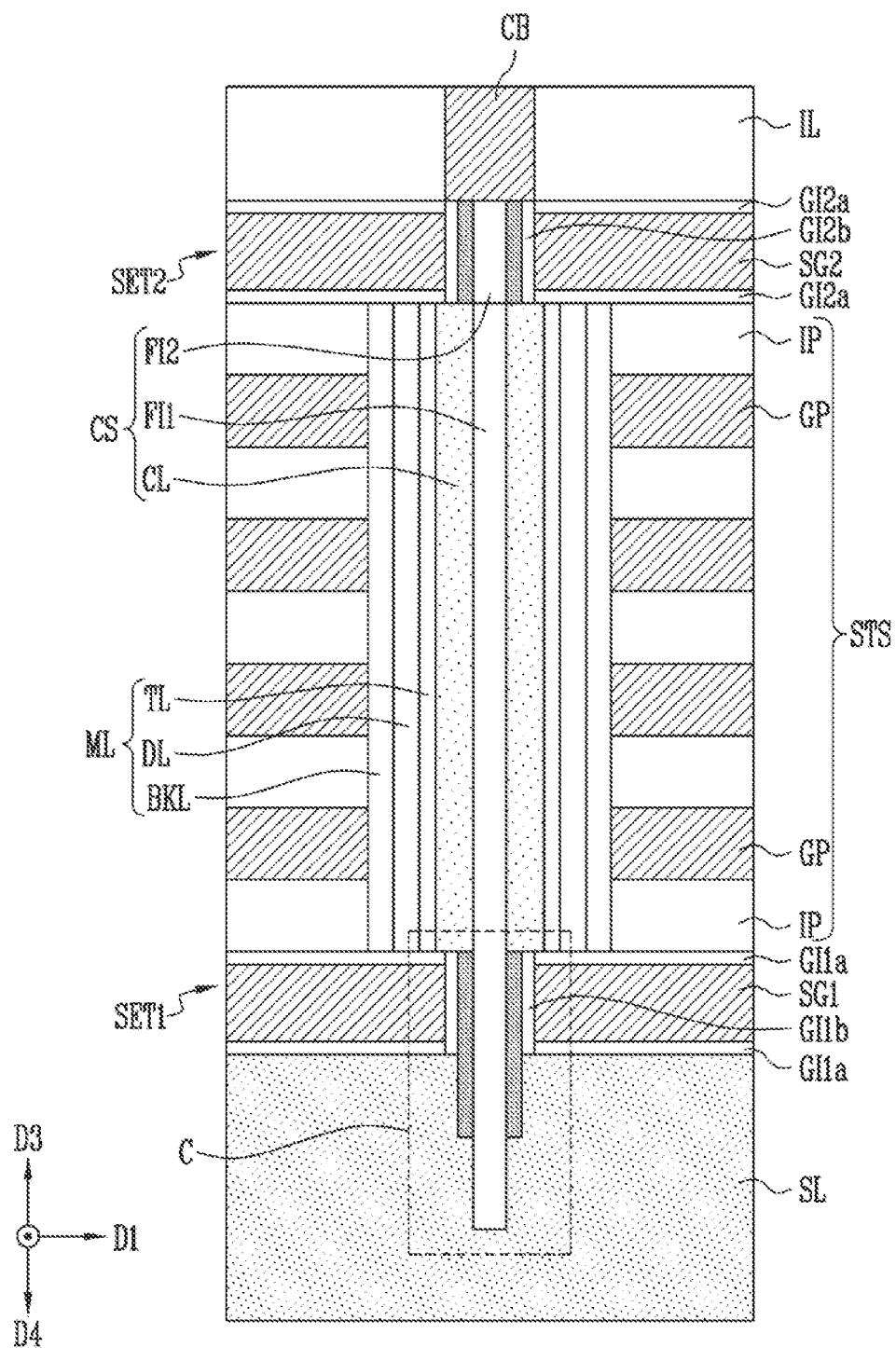
FIG. 7A is a sectional view of a semiconductor device in accordance with embodiments of the present disclosure.
Figure 7B:
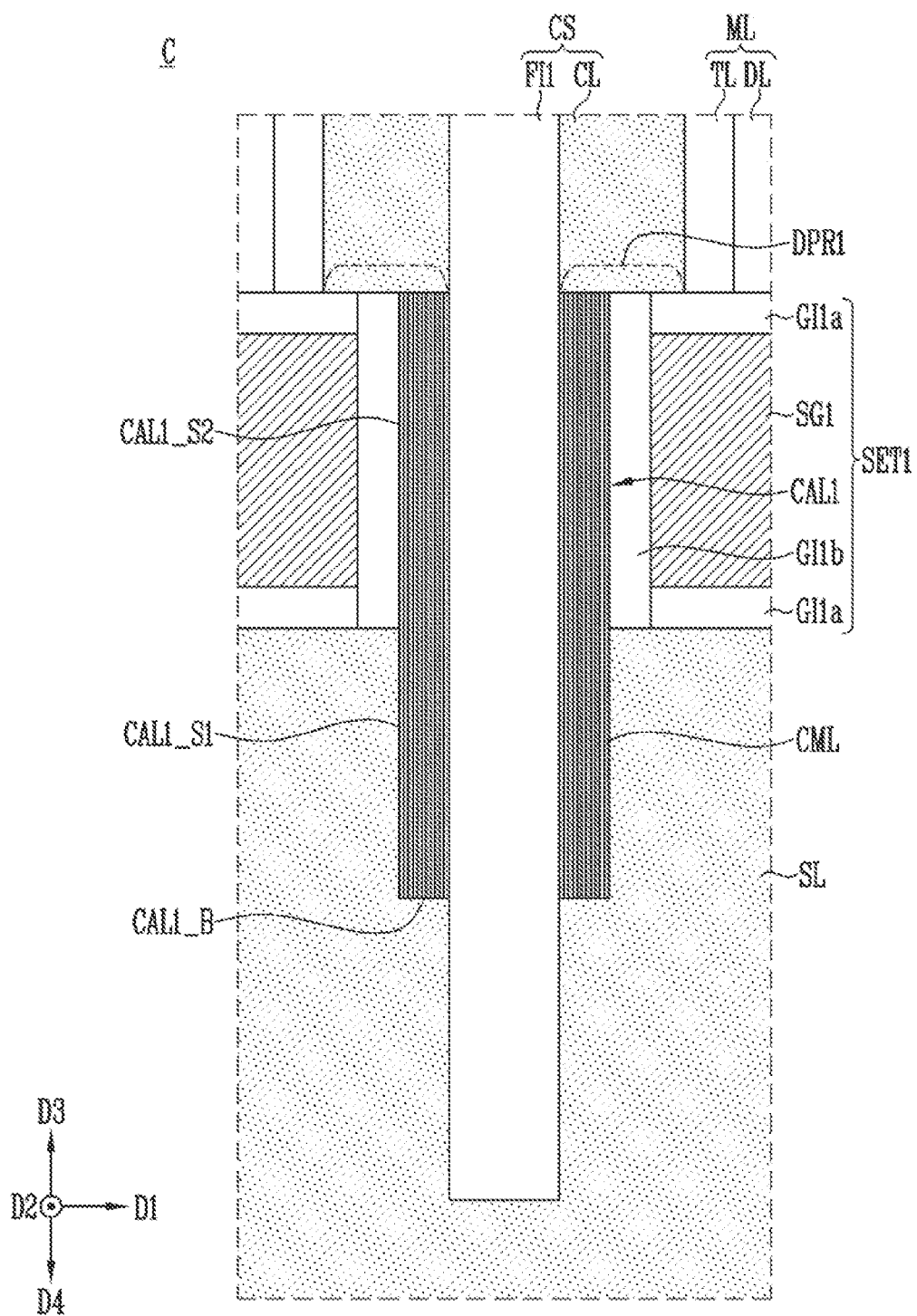
FIG. 7B is an enlarged view of region C shown in FIG. 7A.

FIG. 7A is a sectional view of a semiconductor device in accordance with embodiments of the present disclosure. FIG. 7B is an enlarged view of region C shown in FIG. 7A.

The semiconductor device in accordance with the embodiments shown in FIGS. 7A and 7B may be similar to the semiconductor device in accordance with the embodiments shown in FIGS. 1A to 1C, except portions described below.

Referring to FIGS. 7A and 7B, the first select transistor SET1 of the semiconductor device in accordance with these embodiments may include first gate insulating parts GI1a and a second gate insulating part GI1b. The first gate insulating parts GI1a may cover a top surface and a bottom surface of the first select gate SG1. The second gate insulating part GI1b may cover an inner sidewall of the first select gate SG1. The first gate insulating parts GI1a may extend in the first direction D1. The second gate insulating part GI1b may extend in the third direction D3. The first gate insulating parts GI1a may be spaced apart from each other in the third direction D3 with the first select gate SG1 interposed therebetween.

The outer sidewall of the first carbon layer CAL1 may include a first part CAL1_S1 and a second part CAL1_S2. The first part CAL1_S1 may be in contact with the source layer SL. The second part CAL1_S2 may be in contact with the second gate insulating part GI1b. The first part CAL1_S1 may be a lower portion of the outer sidewall of the first carbon layer CAL1. The second part CAL1_S2 may be an upper portion of the outer sidewall of the first carbon layer CAL1.

The bottom surface CAL1_B of the first carbon layer CAL1 may be in contact with the source layer SL. The first carbon layer CAL1 may include at least one carbon monolayer CML. In an example, the carbon monolayer CML may be single layer graphene.

The second select transistor SET2 may include third gate insulating parts GI2a and a fourth gate insulating part GI2b. The third gate insulating parts GI2a may cover a top surface and a bottom surface of the second select gate SG2. The fourth gate insulating part GI2b may cover an inner sidewall of the second select gate SG2. The third gate insulating parts GI2a may extend in the first direction D1. The fourth gate insulating part GI2b may extend in the third direction D3. The third gate insulating parts GI2a may be spaced apart from each other in the third direction D3 with the second select gate SG2 interposed therebetween.

The channel structure CS may include a first filling layer FI1 and a second filling layer FI2. The first filling layer FI1 may extend to the inside of the source layer SL from the stack structure STS. A bottom surface of the first filling layer FI1 may be located at a level lower than that of the bottom surface CAL1_B of the first carbon layer CAL1. The second filling layer FI2 may be disposed in the second select transistor SET2.

FIGS. 8A, 8B, 8C, 8D, 8E, 8F and 8G are views illustrating a manufacturing method of the semiconductor device in accordance with the embodiments shown in FIGS. 7A and 7B.

Figure 8A:
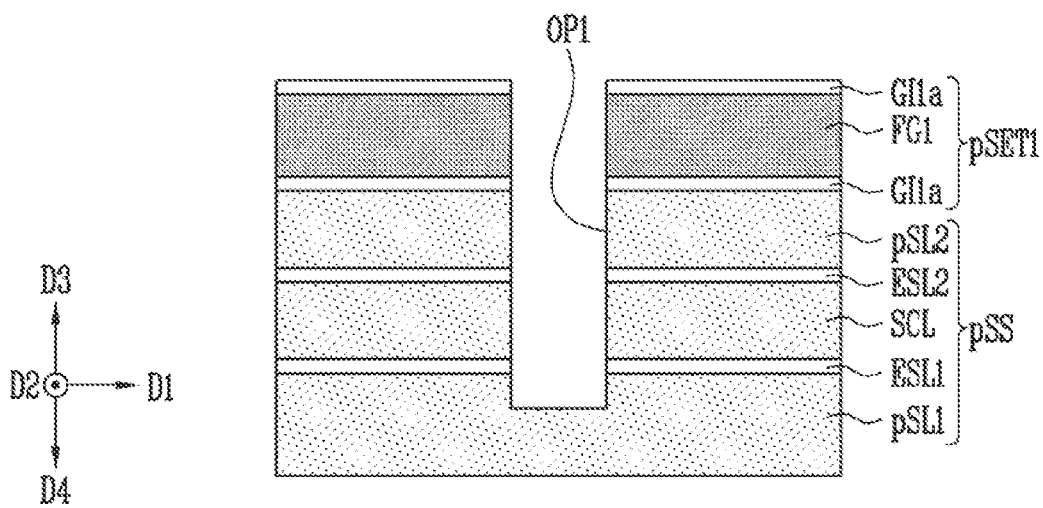
FIGS. 8A, 8B, 8C, 8D, 8E, 8F and 8G are views illustrating a manufacturing method of the semiconductor device in accordance with the embodiment shown in FIGS. 7A and 7B.

Referring to FIG. 8A, a preliminary source structure pSS may be formed. The preliminary source structure pSS may include a first preliminary source layer pSL1, a first etch stop layer ESL1, a source sacrificial layer SCL, a second etch stop layer ESL2, and a second preliminary source layer pSL2, which are sequentially stacked in a third direction D3.

The first preliminary source layer pSL1, the source sacrificial layer SCL, and the second preliminary source layer pSL2 may include a semiconductor material. In an example, the first preliminary source layer pSL1, the source sacrificial layer SCL, and the second preliminary source layer pSL2 may include poly-silicon. The first and second etch stop layers ESL1 and ESL2 may include an insulating material. The first and second etch stop layers ESL1 and ESL2 may include oxide.

A first preliminary select transistor pSET1 may be formed on the preliminary source structure pSS. The first preliminary select transistor pSET1 may include first gate insulating parts GI1a and a first sacrificial gate FG1.

The first gate insulating parts GI1a may include an insulating material. In an example, the first gate insulating parts GI1a may include oxide. The first sacrificial gate FG1 may include an insulating material. In an example, the first sacrificial gate FG1 may include nitride.

A first opening OP1 may be formed, which penetrates the first preliminary select transistor pSET1, the first and second etch stop layers ESL1 and ESL2, the second preliminary source layer pSL2, and the source sacrificial layer SCL.

Figure 8B:
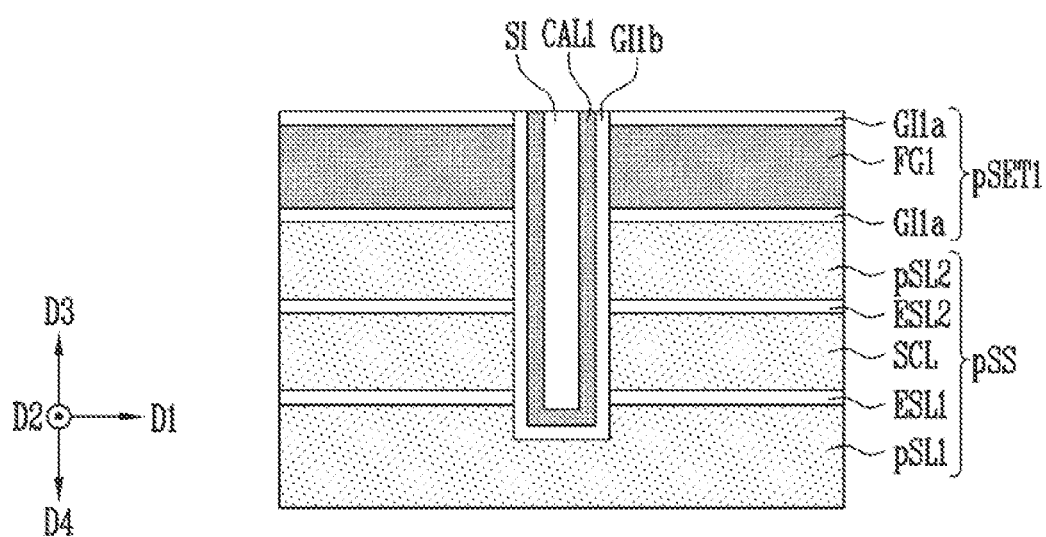

Referring to FIG. 8B, a second gate insulating part GI1b, a first carbon layer CAL1, and a sacrificial filling layer SI may be sequentially formed in the first opening OP1. The second gate insulating part GI1b, the first carbon layer CAL1, and the sacrificial filling layer SI may penetrate the first preliminary select transistor pSET1. The second gate insulating part GI1b, the first carbon layer CAL1, and the sacrificial filling layer SI may fill the first opening OP1. The first carbon layer CAL1 may surround the sacrificial filling layer SI. The second gate insulating part GI1b may surround the first carbon layer CAL1.

The sacrificial filling layer SI may include an insulating material. In an example, the sacrificial filling layer SI may include polysilazane. The second gate insulating part GI1b may include an insulating material. In an example, the second gate insulating part GI1b may include oxide.

Figure 8C:
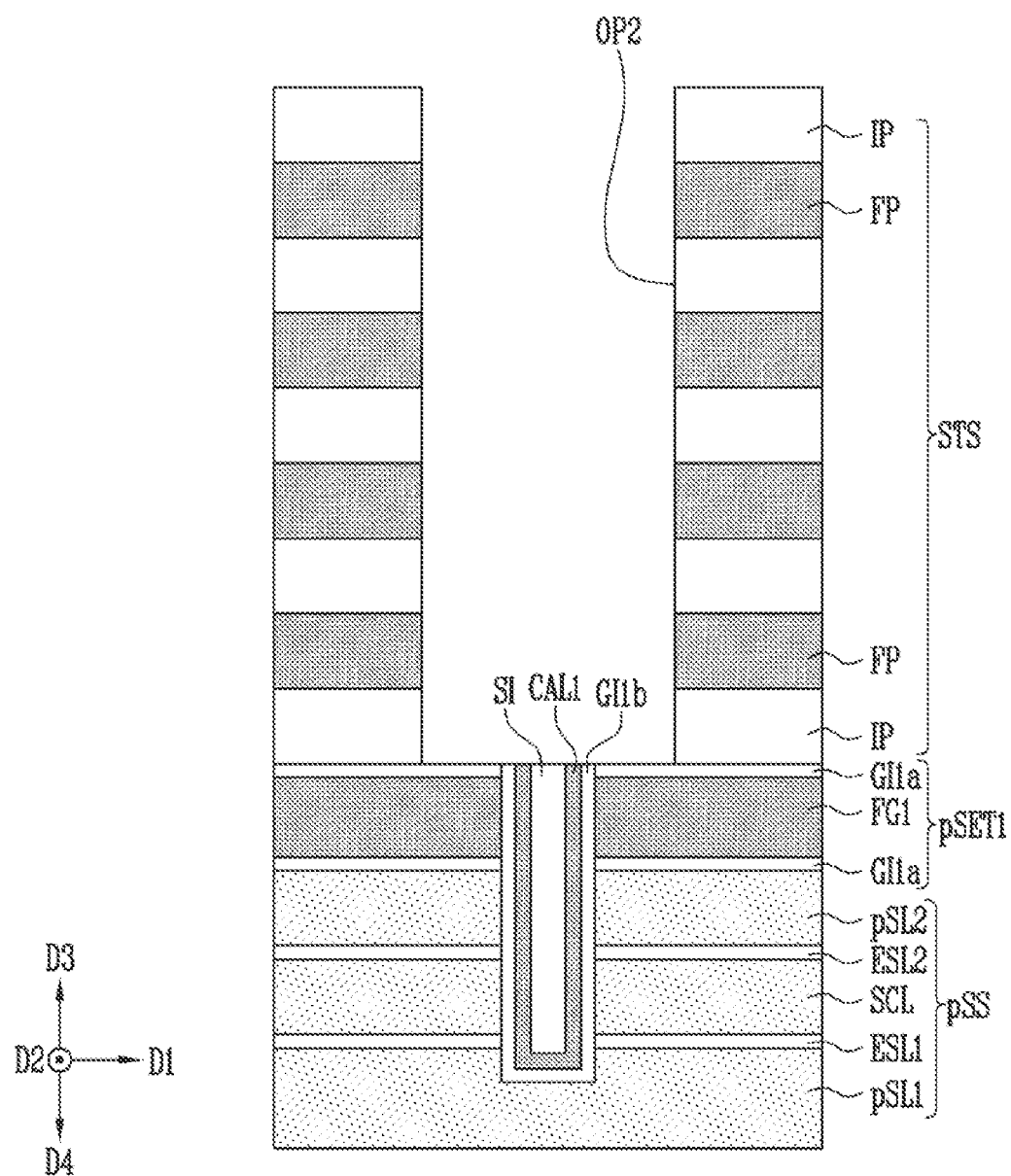

Referring to FIG. 8C, a stack structure STS may be formed on the first preliminary select transistor pSET1. The stack structure STS may include insulating patterns IP and sacrificial patterns FP. The process of forming the stack structure STS may include a process of alternately stacking insulating layers and sacrificial layers and a process of forming the insulating patterns IP and the sacrificial patterns FP by forming a second opening OP2 penetrating the insulating layers and the sacrificial layers.

The insulating patterns IP and the sacrificial patterns FP may include an insulating material. In an example, the insulating patterns IP may include oxide, and the sacrificial patterns FP may include nitride.

Top surfaces of the sacrificial filling layer SI, the first carbon layer CAL1, and the second gate insulating part GI1b may be exposed by the second opening OP2.

Figure 8D:
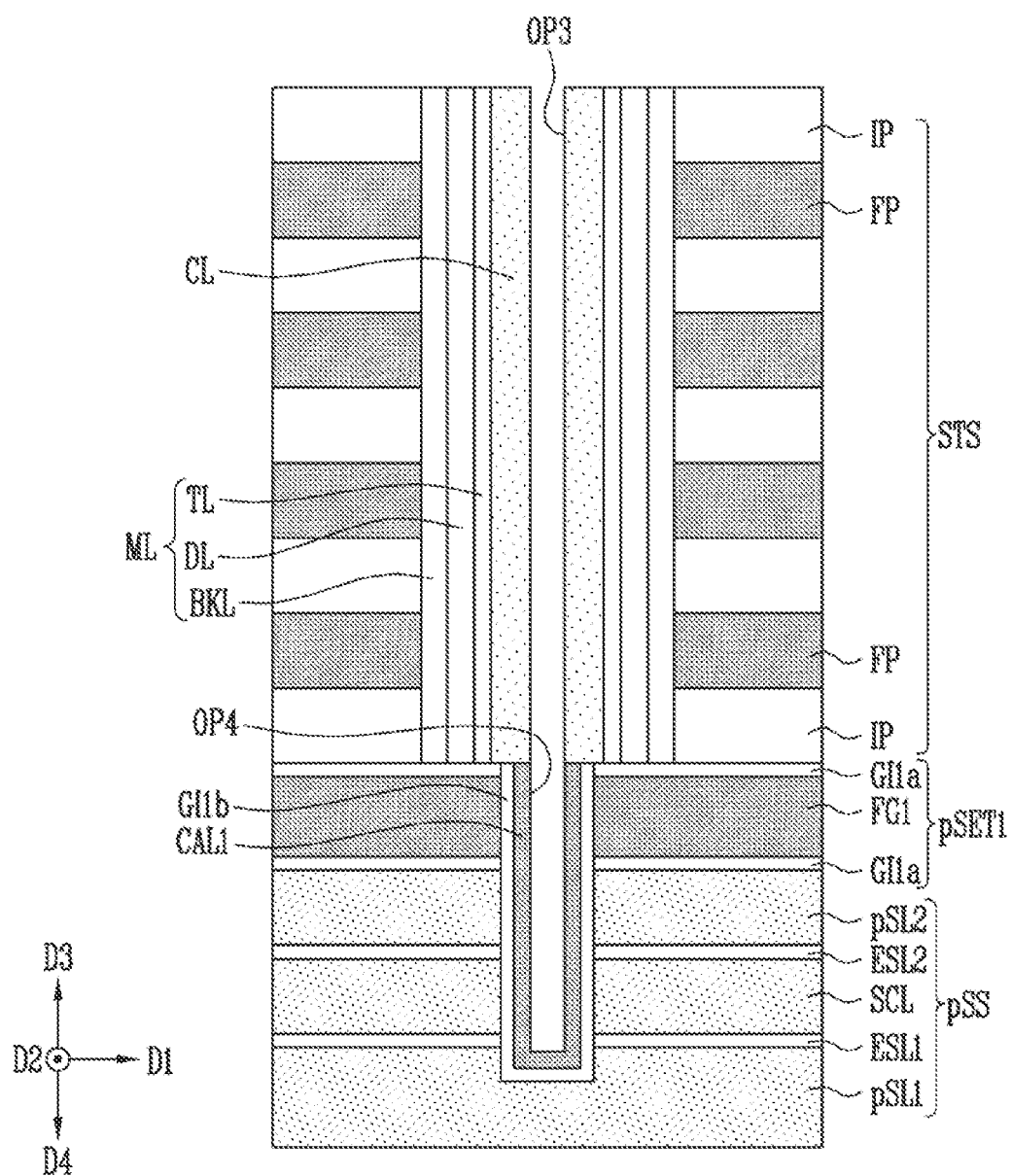

Referring to FIG. 8D, a memory layer ML and a channel layer CL may be formed in the second opening OP2. The memory layer may include a tunnel insulating layer TL, a data storage layer DL, and a blocking layer BKL. The memory layer ML may surround the channel layer CL. The channel layer CL may be connected to the first carbon layer CAL1.

A third opening OP3 may be defined by an inner sidewall of the channel layer CL. The third opening OP3 may be a portion of the second opening OP2, which is not filled by the memory layer ML and the channel layer CL.

The sacrificial filling layer SI exposed by the third opening OP3 may be removed. When the sacrificial filling layer SI is removed, a fourth opening OP4 may be formed.

Figure 8E:
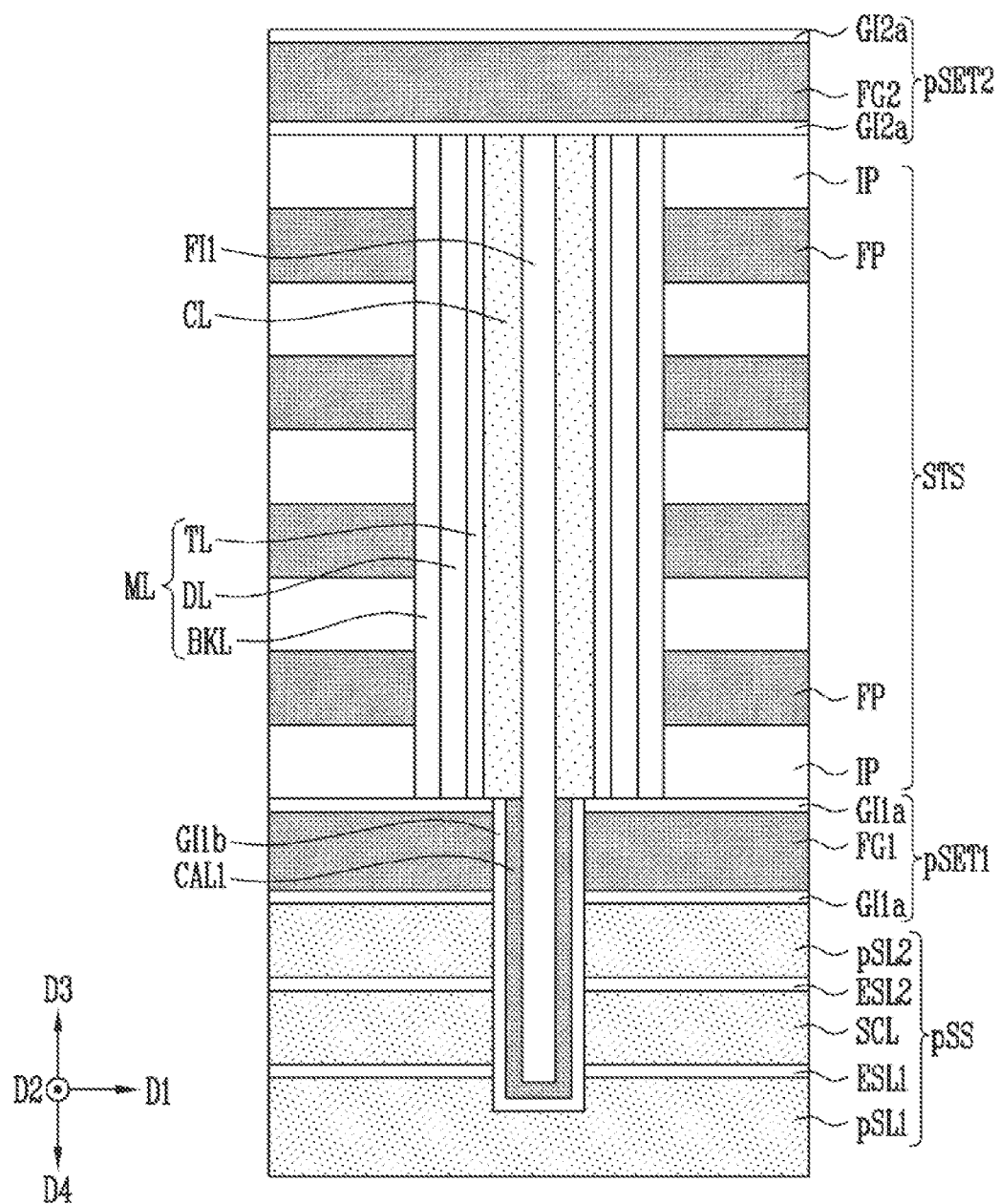

Referring to FIG. 8E, a first filling layer FI1 may be formed in the third opening OP3 and the fourth opening OP4. The first filling layer FI1 may include an insulating material. In an example, the first filling layer FI1 may include oxide.

A second preliminary select transistor pSET2 may be formed on the stack structure STS. The second preliminary select transistor pSET2 may include third gate insulating parts GI2a and a second sacrificial gate FG2.

The third gate insulating parts GI2a may include an insulating material. In an example, the third gate insulating parts GI2a may include oxide. The second sacrificial gate FG2 may include an insulating material. In an example, the second sacrificial gate FG2 may include nitride.

Figure 8F:
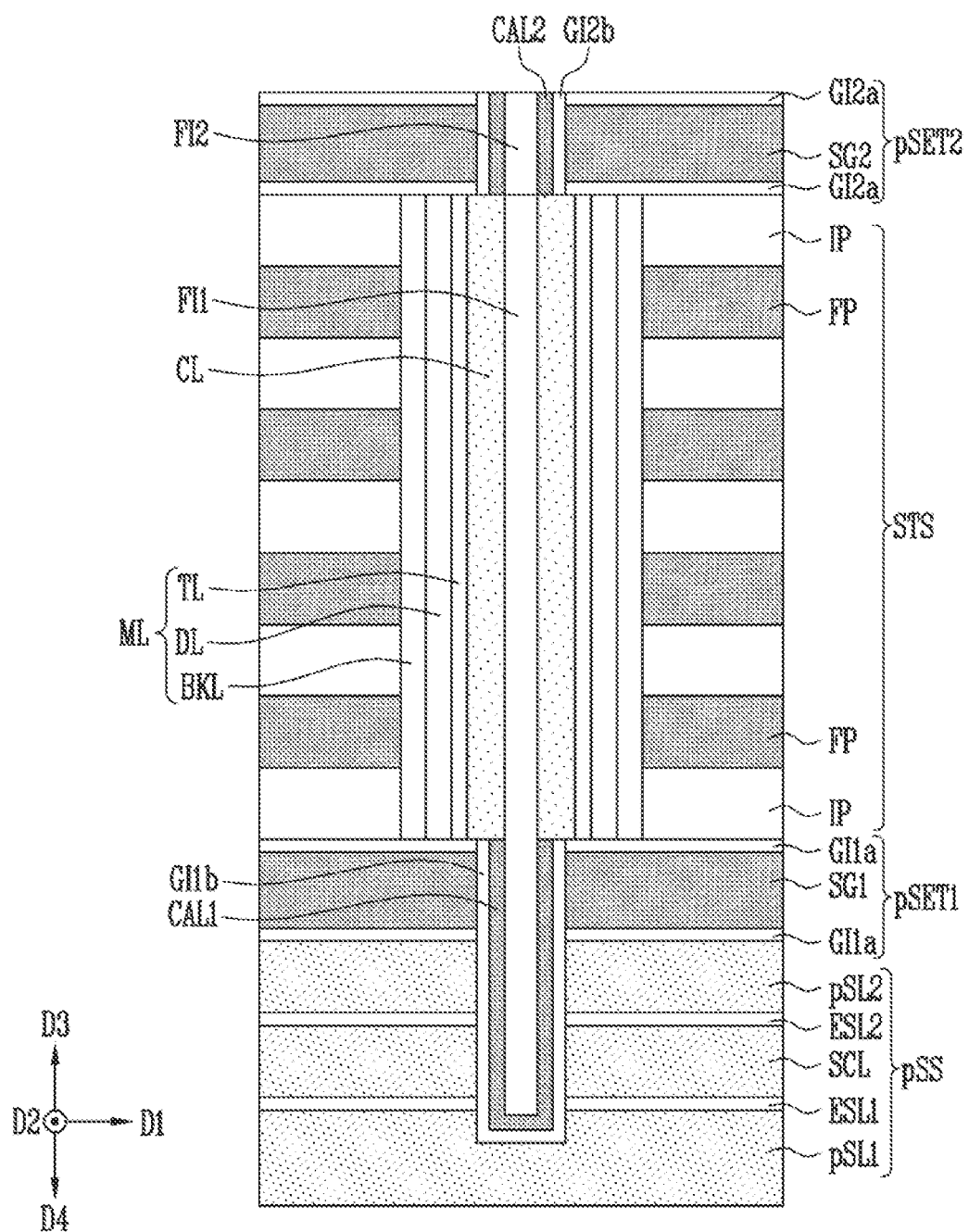

Referring to FIG. 8F, a fourth gate insulating part GI2b, a second carbon layer CAL2, and a second filling layer FI2 may be formed, which penetrate the second preliminary select transistor pSET2. The second carbon layer CAL2 may surround the second filling layer FI2. The fourth gate insulating part GI2b may surround the second carbon layer CAL2. The second carbon layer CAL2 may be connected to the channel layer CL.

The fourth gate insulating part GI2b and the second filling layer FI2 may include an insulating material. In an example, the fourth gate insulating part GI2b and the second filling layer FI2 may include oxide.

Figure 8G:
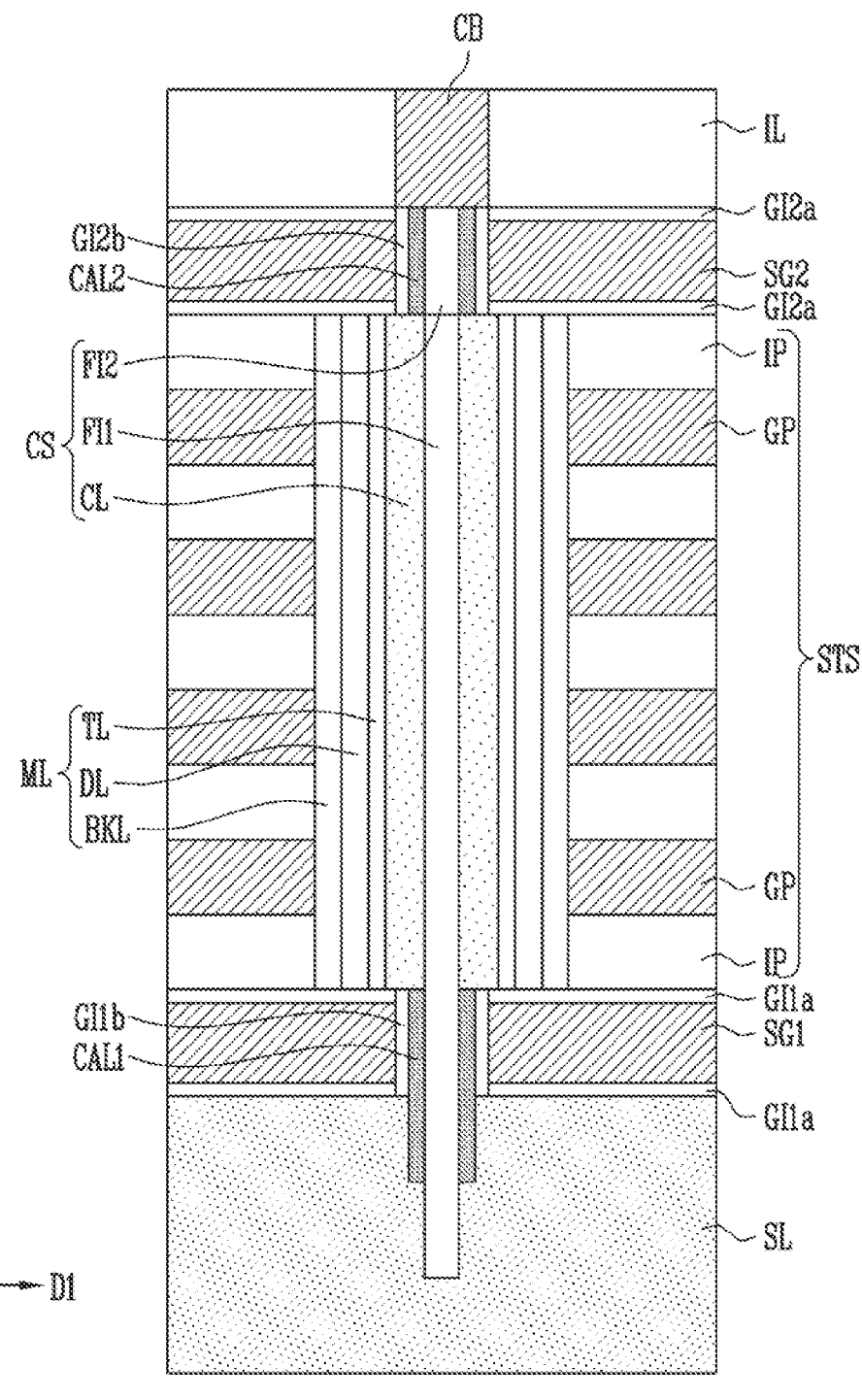

Referring to FIG. 8G, a source layer SL may be formed. The process of forming the source layer SL may include a process of removing the source sacrificial layer SCL, a process of removing the first and second etch stop layers ESL1 and ESL2 exposed by removing the source sacrificial layer SCL, and a process of filling a semiconductor material in a space in which the source sacrificial layer SCL and the first and second etch stop layers ESL1 and ESL2 are removed.

While the first and second etch stop layers ESL1 and ESL2 are being removed, a lower portion of the second gate insulating part GI1b may be removed together with the first and second etch stop layers ESL1 and ESL2. When the lower portion of the second gate insulating part GI1b is removed, a lower portion of the first carbon layer CAL1 may be exposed. The lower portion of the first carbon layer CAL1 may be a portion disposed in the preliminary source structure pSS. Before the semiconductor material is filled in the space in which the source sacrificial layer SCL and the first and second etch stop layers ESL1 and ESL2 are removed, the lower portion of the first carbon layer CAL1 may be removed.

The first sacrificial gate FG1, the sacrificial patterns FP, and the second sacrificial gate FG2 may be removed, and a first select gate SG1, a gate pattern GP, and a second select gate SG2 may be formed.

An insulating layer IL and a conductor GB may be formed. The conductor CB may be connected to the second carbon layer CAL2.

Figure 9:
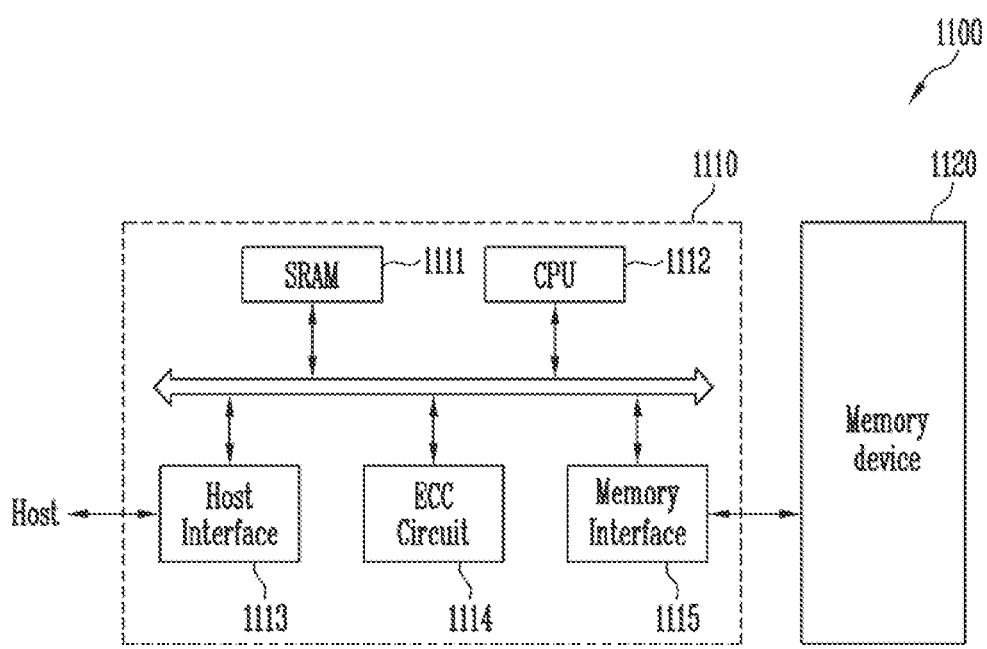
FIG. 9 is a block diagram illustrating a configuration of a memory system in accordance with embodiments of the present disclosure.

FIG. 9 is a block diagram illustrating a configuration of a memory system in accordance with embodiments of the present disclosure.

Referring to FIG. 9, the memory system 1100 in accordance with the embodiments of the present disclosure includes a memory device 1120 and a memory controller 1110.

The memory device 1120 may include the structure described with reference to FIGS. 1A to 1C, 4A and 4B, 5A and 5B, 6A and 6B, or 7A and 7B. The memory device 1120 may be a multi-chip package configured with a plurality of flash memory chips.

The memory controller 1110 is configured to control the memory device 1120, and may include a Static Random Access Memory (SRAM) 1111, a Central Processing Unit (CPU) 1112, a host interface 1113, an Error Correction Code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 10:
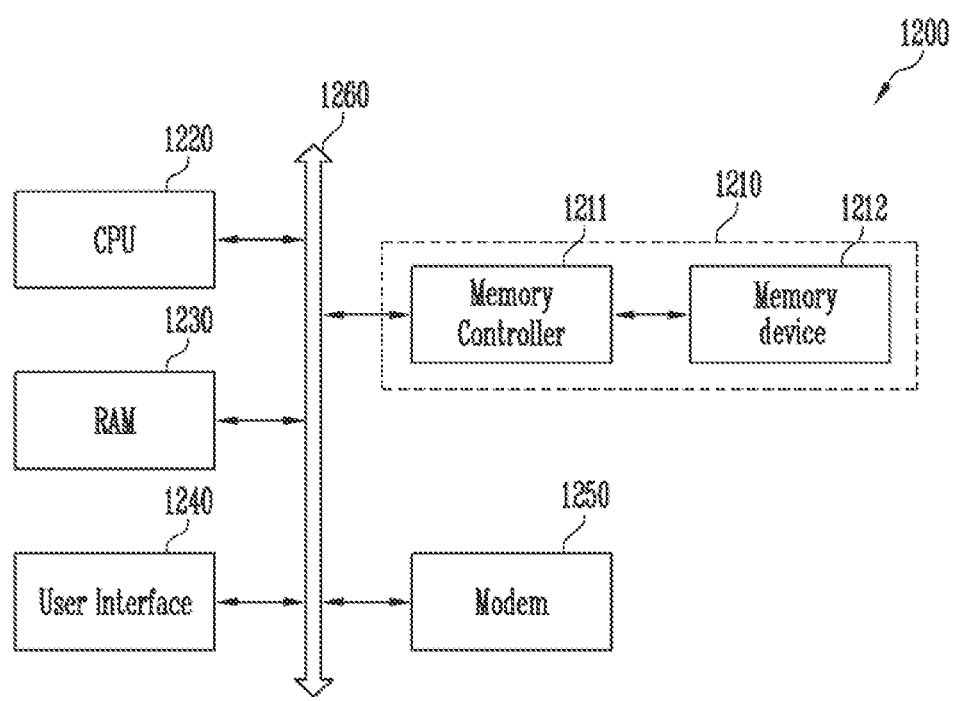
FIG. 10 is a block diagram illustrating a configuration of a computing system in accordance with embodiments of the present disclosure.

FIG. 10 is a block diagram illustrating a configuration of a computing system in accordance with embodiments of the present disclosure.

Referring to FIG. 10, the computing system 1200 in accordance with the embodiments of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor, a mobile D-RAM, and the like may be further included.

The memory system 1200 may be configured with a memory device 1212 and a memory controller 1211 as described with reference to FIG. 9.

In the semiconductor device in accordance with the present disclosure, a channel of a drain select transistor or a source select transistor can be configured with a carbon layer. Accordingly, the switching speed of the channel of the drain select transistor or the source select transistor can be improved, and the operational reliability of the semiconductor device can be improved.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor device comprising:
a stack structure including gate patterns and insulating patterns;
a channel layer penetrating the stack structure;
a source layer spaced apart from the stack structure;
a conductor spaced apart from the stack structure;
a first select transistor between the stack structure and the source layer; and
a second select transistor between the stack structure and the conductor,
wherein the first select transistor includes:
a first carbon layer in contact with the source layer and the channel layer;
a first select gate spaced apart from the first carbon layer; and
a first gate insulating layer between the first select gate and the first carbon layer, and
wherein the second select transistor includes:
a second carbon layer in contact with the conductor and the channel layer;
a second select gate spaced apart from the second carbon layer; and
a second gate insulating layer between the second select gate and the second carbon layer.

2. The semiconductor device of claim 1, wherein a top surface of the first carbon layer is in contact with a bottom surface of the channel layer, and a bottom surface of the first carbon layer is in contact with a top surface of the source layer.

3. The semiconductor device of claim 1, wherein a bottom surface of the second carbon layer is in contact with a top surface of the channel layer, and a top surface of the second carbon layer is in contact with a bottom surface of the conductor.

4. A method of manufacturing a semiconductor device, the method comprising:
   forming a first preliminary select transistor;
   forming a first carbon layer penetrating the first preliminary select transistor;
   forming a stack structure on the first preliminary select transistor; and
   forming a channel layer penetrating the stack structure, the channel layer being Schottky-joined with the first carbon layer.

5. The method of claim 4, further comprising:
   forming a second preliminary select transistor on the stack structure; and
   forming a second carbon layer penetrating the second preliminary select transistor.

6. The method of claim 5, wherein the second carbon layer is Schottky-joined with the channel layer.

7. The method of claim 4, wherein the first preliminary select transistor includes a sacrificial gate and first gate insulating parts covering a top surface and a bottom surface of the sacrificial gate.

8. The method of claim 4, further comprising forming a second gate insulating part penetrating the first preliminary select transistor.

9. The method of claim 8, wherein the second gate insulating part surrounds the first carbon layer.

10. The method of claim 9, further comprising:
    forming a preliminary source structure; and
    removing a lower portion of the first carbon layer,
    wherein the lower portion of the first carbon layer is disposed in the preliminary source structure.

* * * * *